(12) United States Patent
Izumiya et al.

(10) Patent No.: US 9,046,808 B2
(45) Date of Patent: Jun. 2, 2015

(54) SURFACE EMITTING LASER ARRAY AND IMAGE FORMING APPARATUS

(71) Applicants: Kazuma Izumiya, Miyagi (JP); Kazuhiro Harasaka, Miyagi (JP)

(72) Inventors: Kazuma Izumiya, Miyagi (JP); Kazuhiro Harasaka, Miyagi (JP)

(73) Assignee: RICOH COMPANY, LTD., Tokyo (JP)

( * ) Notice: Subject to any disclaimer, the term of this patent is extended or adjusted under 35 U.S.C. 154(b) by 101 days.

(21) Appl. No.: 13/724,191

(22) Filed: Dec. 21, 2012

(65) Prior Publication Data

US 2013/0208067 A1 Aug. 15, 2013

(30) Foreign Application Priority Data

Feb. 13, 2012 (JP) ................................. 2012-027969

(51) Int. Cl.
| | |
|---|---|
| H01S 3/10 | (2006.01) |
| H01S 3/13 | (2006.01) |
| B41J 2/435 | (2006.01) |
| B41J 2/455 | (2006.01) |
| G03G 15/04 | (2006.01) |
| H01S 5/42 | (2006.01) |
| B82Y 20/00 | (2011.01) |
| H01S 5/042 | (2006.01) |
| H01S 5/183 | (2006.01) |
| H01S 5/32 | (2006.01) |
| H01S 5/343 | (2006.01) |

(52) U.S. Cl.
CPC ............ *G03G 15/04072* (2013.01); *H01S 5/42* (2013.01); *G03G 2215/0132* (2013.01); *H01S 5/0425* (2013.01); *H01S 5/18391* (2013.01); *H01S 5/3202* (2013.01); *H01S 5/3434* (2013.01); *H01S 5/423* (2013.01); *H01S 2301/14* (2013.01); *B82Y 20/00* (2013.01)

(58) Field of Classification Search
CPC ... H01S 5/0425; H01S 5/42; G03G 15/04072; G03G 2215/0132
USPC .......................... 347/224, 233; 372/24, 29.013
See application file for complete search history.

(56) References Cited

U.S. PATENT DOCUMENTS

| 7,245,646 B2 | 7/2007 | Kaneko |
|---|---|---|
| 7,920,615 B2 | 4/2011 | Maeda et al. |
| 7,978,739 B2 | 7/2011 | Sugawara et al. |

(Continued)

FOREIGN PATENT DOCUMENTS

| JP | 2005-209717 | 8/2005 |
|---|---|---|
| JP | 2006-13366 | 1/2006 |

(Continued)

*Primary Examiner* — Sarah Al Hashimi
(74) *Attorney, Agent, or Firm* — Cooper & Dunham LLP

(57) ABSTRACT

A surface emitting laser array includes a light emitting unit having a lower reflection mirror, a resonator structure including an active layer, and an upper reflection mirror laminated on a substrate; an electrode for the light emitting unit; a wiring member that establishes electrical connection between the light emitting unit and the electrode; and the substrate on which more than one of the light emitting units, the electrodes, and the wiring members are arranged. The light emitting unit has anisotropic internal stress, and the distance between the center of a first light emitting unit and the center line of the corresponding wiring member is arranged to be different from the distance between the center of a second light emitting unit and the center line of the corresponding wiring member so that variations in the polarization directions of the light emitting units may be within a predetermined range.

15 Claims, 41 Drawing Sheets

(56) References Cited

U.S. PATENT DOCUMENTS

| | | |
|---|---|---|
| 7,991,033 B2 | 8/2011 | Hara et al. |
| 8,035,676 B2 | 10/2011 | Harasaka et al. |
| 8,089,498 B2 | 1/2012 | Sato et al. |
| 8,111,725 B2 * | 2/2012 | Ishii et al. ............ 372/44.011 |
| 2011/0115872 A1 | 5/2011 | Harasaka et al. |
| 2011/0128343 A1 | 6/2011 | Sato et al. |
| 2011/0170155 A1 | 7/2011 | Jikutani et al. |
| 2011/0217077 A1 | 9/2011 | Harasaka et al. |
| 2011/0228035 A1 | 9/2011 | Ishii et al. |
| 2011/0261850 A1 * | 10/2011 | Shouji et al. ............ 372/45.01 |
| 2012/0057902 A1 | 3/2012 | Shouji et al. |
| 2012/0086765 A1 | 4/2012 | Higashi et al. |
| 2012/0121297 A1 | 5/2012 | Jikutani et al. |
| 2012/0294652 A1 | 11/2012 | Itoh et al. |

FOREIGN PATENT DOCUMENTS

| | | |
|---|---|---|
| JP | 3791193 | 6/2006 |
| JP | 2007-318079 | 12/2007 |
| JP | 2007318079 A * | 12/2007 |
| JP | 2008-16824 | 1/2008 |
| JP | 2010-34506 | 2/2010 |
| WO | 2011/148957 A1 | 12/2011 |

* cited by examiner

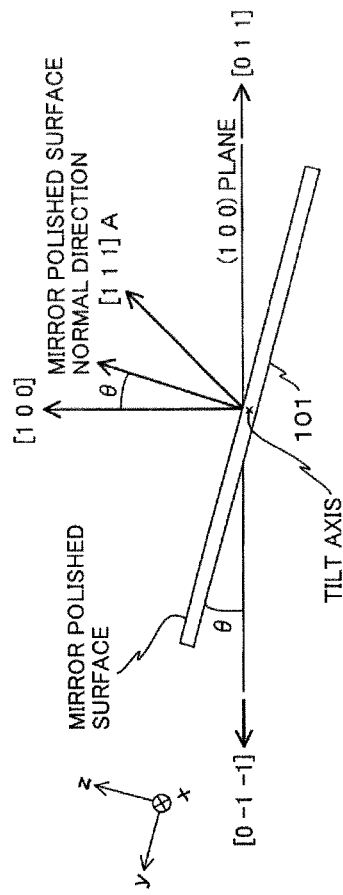
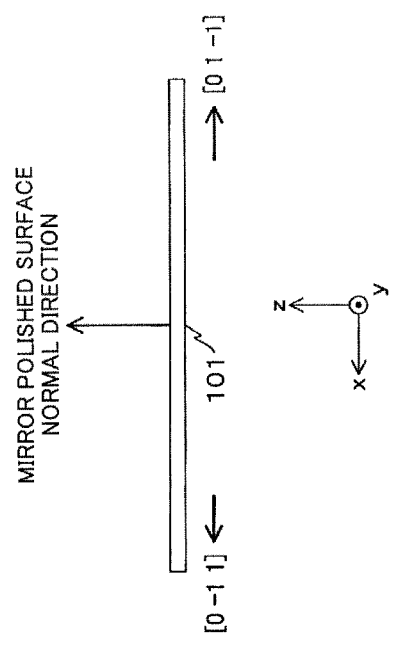
FIG.8A
FIG.8B

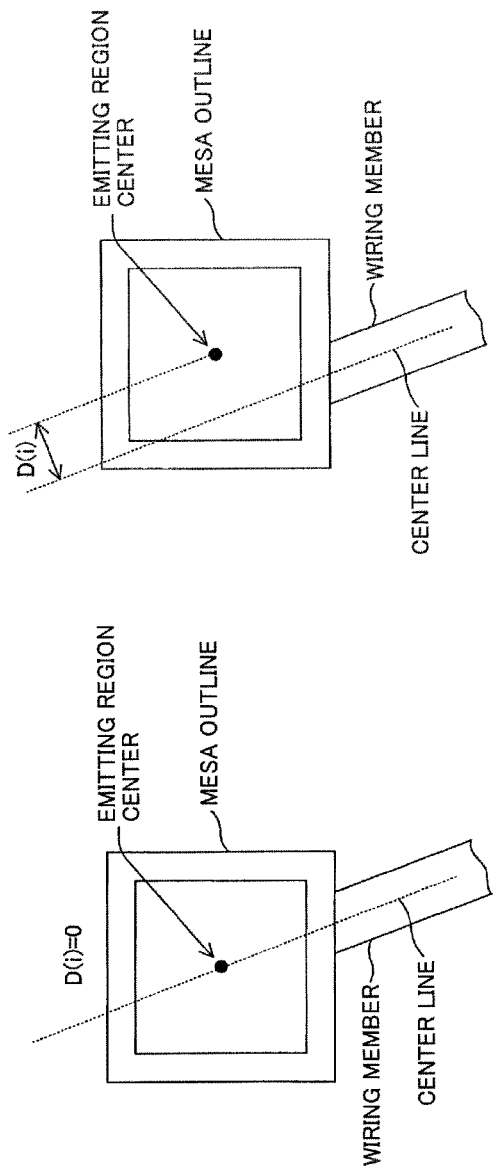

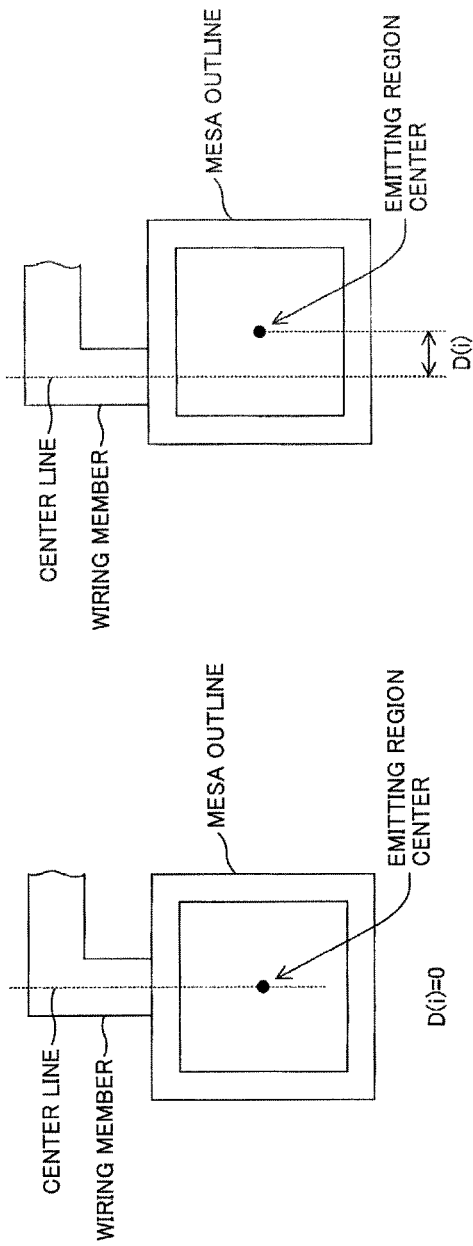

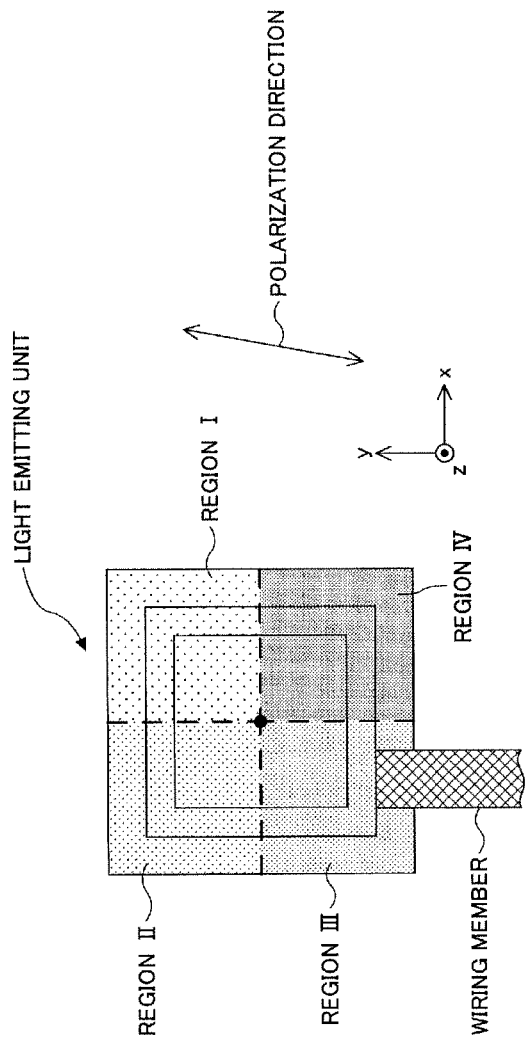

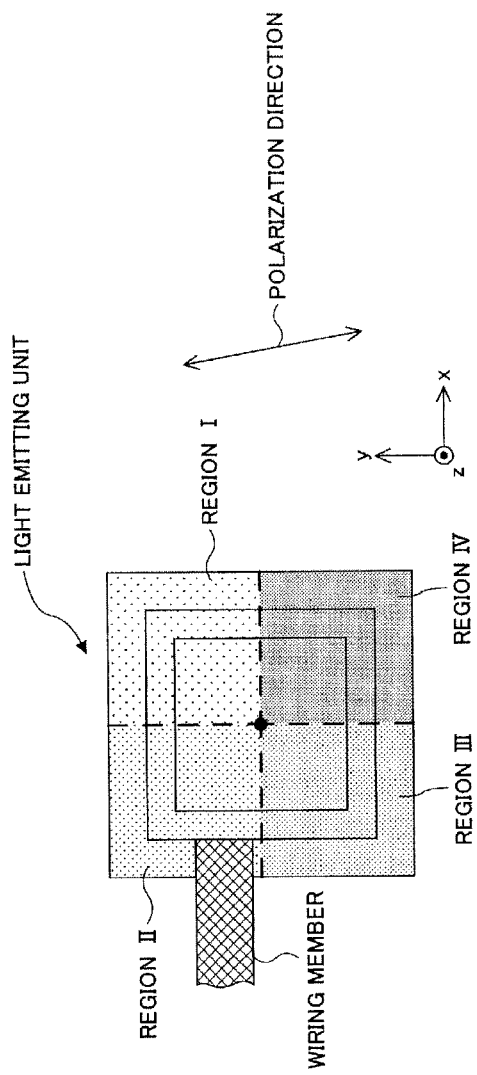

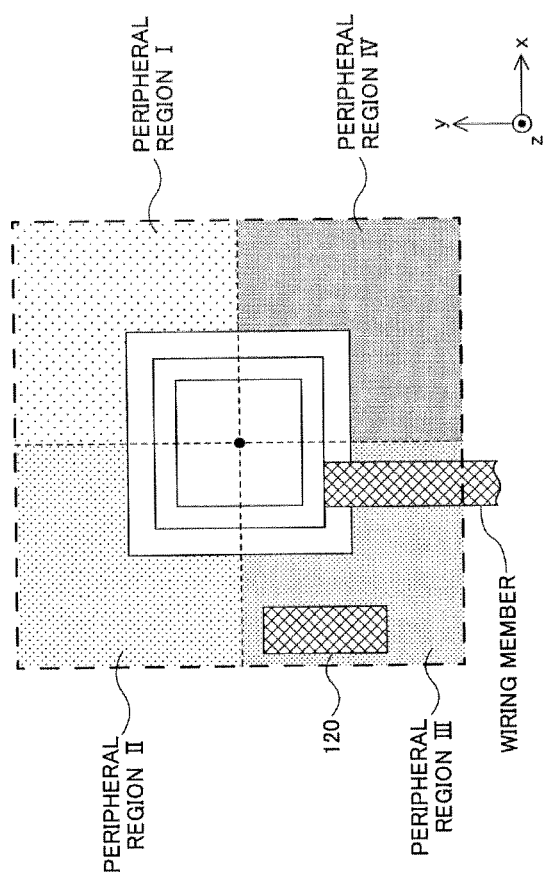

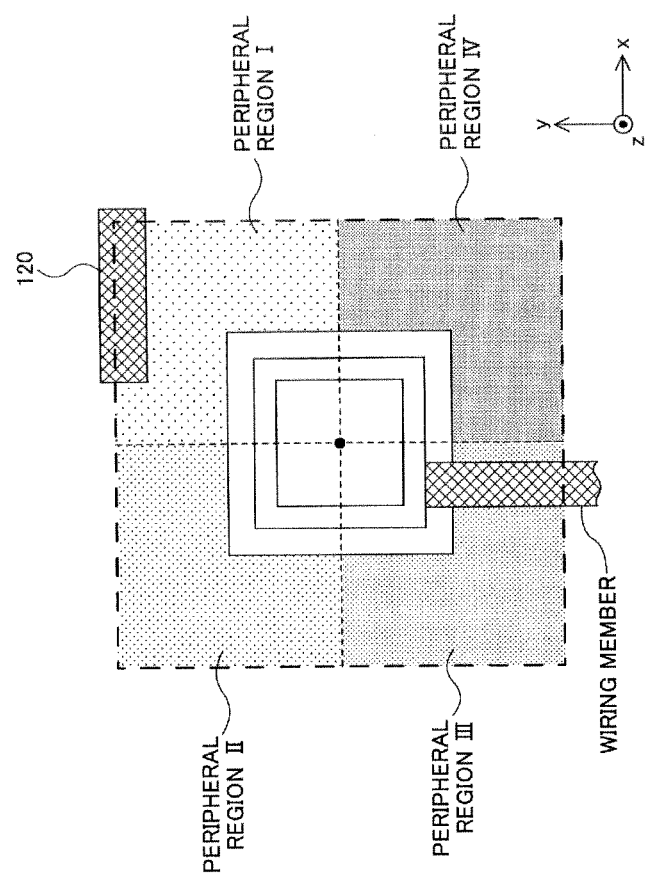

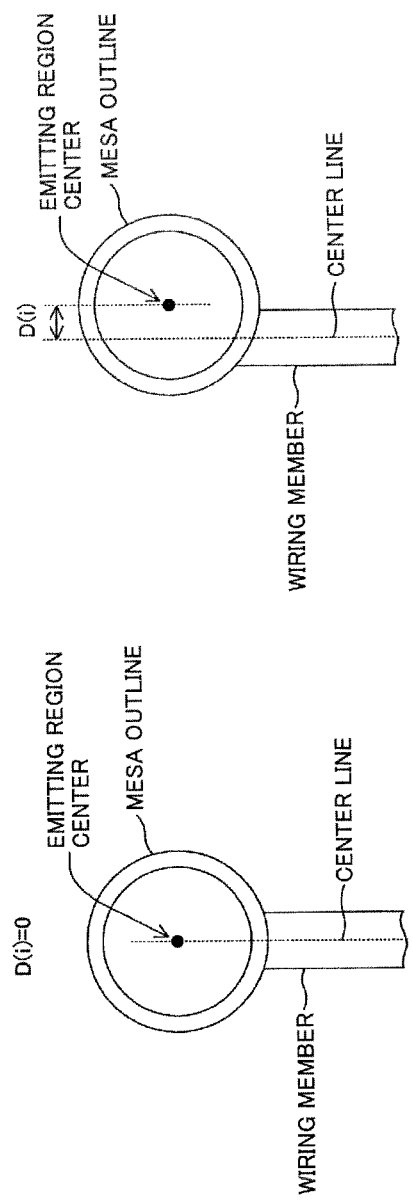

SURFACE EMITTING LASER ARRAY AND IMAGE FORMING APPARATUS

BACKGROUND OF THE INVENTION

1. Field of the Invention

The disclosures herein generally relate to a surface laser array and an image forming apparatus, and particularly to a surface emitting laser array that includes plural light emitting units and an image forming apparatus that includes such surface emitting laser array.

2. Description of the Related Art

In a surface emitting laser array that includes plural light emitting units, the polarization directions of plural light beams emitted from the light emitting units are desirably arranged to be in the same direction.

When the polarization directions of the plural light beams emitted from the surface emitting laser array are not uniform, discrepancies in light intensity may occur in the plural light beams that have passed an optical system. For example, when such a surface emitting laser array is used as a write light source of a laser printer, unevenness in color distribution may occur in the output image, for example.

Various techniques have been disclosed for controlling the polarization direction of a light beam emitted from a surface emitting laser to a desired direction (see e.g., Patent Documents 1-3).

[Patent Document 1] Japanese Patent No. 3791193
[Patent Document 2] Japanese Laid-Open Patent Publication No. 2006-013366
[Patent Document 3] Japanese Laid-Open Patent Publication No. 2008-016824

Patent Document 1 discloses a surface emitting laser element having an active layer and a mirror layer arranged on a tilted surface of a semiconductor substrate that is tilted at a predetermined tilt angle with respect to a surface including a crystal axis corresponding to a reference of the semiconductor substrate. Further, an electrode for supplying a current to the active layer via the mirror layer formed above the active layer and wiring for guiding the current to the electrode are formed on the tilted surface. The wiring includes an elongated wiring that is directly connected to the electrode, and the elongated direction of the wiring is arranged to correspond to the tilting direction of the tilted surface. Patent Document 1 also discloses a surface emitting laser array that has the above surface emitting laser elements arranged into a two-dimensional array and a matrix wiring connected to the surface emitting laser elements.

Patent Document 2 discloses a vertical cavity surface emitting laser (VCSEL) that has two orthogonally intersecting planes (X and Y planes) that are perpendicular to a horizontal surface of a substrate and have an origin located around the center of a mesa structure. When the two planes intersect the side surfaces of the mesa structure at plane intersection lines Lx1, Lx2, Ly1, and Ly2 respectively, and when the plane intersection lines Lx1, Lx2, Ly1, and Ly2 make angles of Ax1, Ax2, Ay1, and Ay2 with the horizontal surface of the substrate respectively; at least one of Ax1, Ax2, Ay1, and Ay2 is different from the other.

Patent Document 3 discloses a surface emitting semiconductor laser that has a substrate on which a light emission unit is arranged. The light emission unit has a first multi-layer reflective mirror, an active layer including one or more light emitting regions, and a second multi-layer reflective mirror stacked in this order. At least one of the first multi-layer reflective mirror or the second multi-layer reflective mirror has an oxidized portion distributed unevenly around the region corresponding to the light emitting region. The light emission unit has a groove that surrounds the oxidized portion, and the groove is arranged to have an uneven depth in accordance with the uneven distribution of the oxidized portion.

However, it has been difficult to reduce variations in the polarization directions of plural light beams emitted from plural light emitting units without changing (lowering) the density of the surface emitting laser array.

SUMMARY OF THE INVENTION

It is a general object of at least one embodiment of the present invention to provide a surface emitting laser array that substantially obviates one or more problems caused by the limitations and disadvantages of the related art.

It is noted that the inventors of the present invention have discovered that even when plural light emitting units are arranged into a configuration such that the polarization directions of light beams emitted from these light emitting units may be uniform, the polarization direction of the light beams emitted from one or more of the light emitting units may be changed when a wiring member is arranged.

In turn, the inventors of the present invention have conducted numerous tests to find that the extent and direction of change in the above polarization direction varies depending on the manner in which the wiring member is arranged.

At least one embodiment of the present invention is based on such new findings of the inventors of the present invention.

In one embodiment, a surface emitting laser array includes a light emitting unit having a lower reflection mirror, a resonator structure including an active layer, and an upper reflection mirror laminated on a substrate; an electrode arranged for the light emitting unit; a wiring member that establishes electrical connection between the light emitting unit and the electrode; and the substrate on which more than one of the light emitting units, the electrodes, and the wiring members are arranged. The light emitting unit has anisotropic internal stress; and when viewed from a direction orthogonal to the substrate, a first distance between the center of a first light emitting unit of the light emitting units and the center line of the wiring member connected to the first light emitting unit is arranged to be different from a second distance between the center of a second light emitting unit of the light emitting units and the center line of the wiring member connected to the second light emitting unit so that a variation in the polarization directions of the light emitting units is arranged to be within a predetermined range.

According to an aspect of the present invention, variations in the polarization directions of plural light beams emitted from plural light emitting units of the surface emitting laser array may be reduced without lowering the integration density of the light emitting units.

BRIEF DESCRIPTION OF THE DRAWINGS

Other objects and further features of embodiments will be apparent from the following detailed description when read in conjunction with the accompanying drawings, in which:

FIGS. 8A and 8B are diagrams showing a substrate of the surface emitting laser array;

FIGS. 22A and 22B are diagrams showing first exemplary arrangements of the wiring member with respect to the light emitting unit;

FIGS. 23A and 23B are diagrams showing second exemplary arrangements of the wiring member with respect to the light emitting unit;

FIGS. 26A and 26B are a first set of diagrams illustrating the relationship between the connection position of the wiring member and the polarization direction of the light emitting unit;

FIGS. 27A and 27B are a second set of diagrams illustrating the relationship between the connection position of the wiring member and the polarization direction of the light emitting unit;

FIGS. 32A and 32B are a first set of diagrams showing exemplary arrangements of the metal member;

FIGS. 33A and 33B are a second set of diagrams showing exemplary arrangements of the metal member;

FIGS. 34A and 34B are diagrams illustrating exemplary cases in which a mesa is cylindrically shaped.

DESCRIPTION OF THE PREFERRED EMBODIMENTS

In the following, embodiments of the present invention are described with reference to the accompanying drawings.

Figure 1:
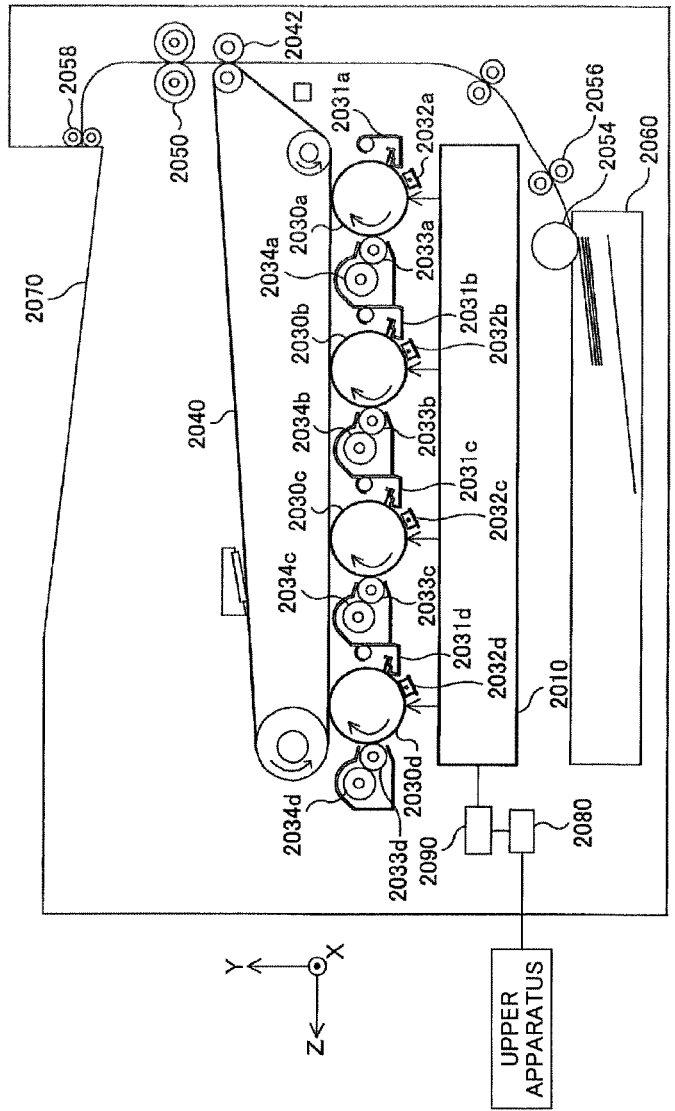
FIG. 1 is a diagram showing an overall configuration of a color printer according to an embodiment of the present invention.
Figure 2:
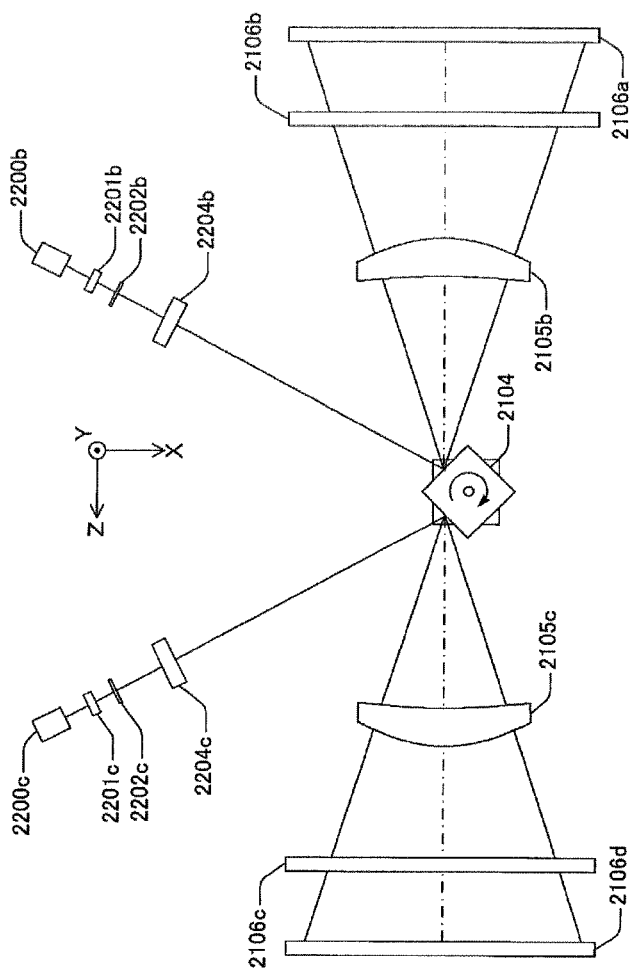
FIG. 2 is a first diagram of an optical scanning device of the color printer shown in FIG. 1.
Figure 3:
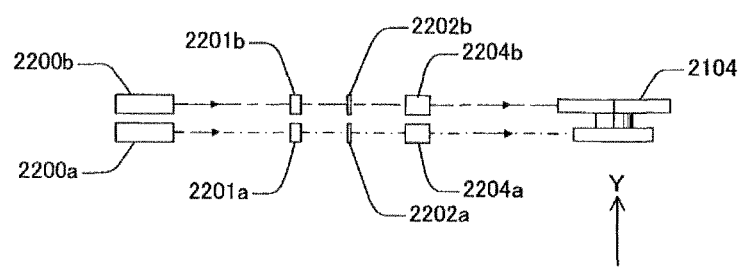
FIG. 3 is a second diagram of the optical scanning device of the color printer shown in FIG. 1.
Figure 4:
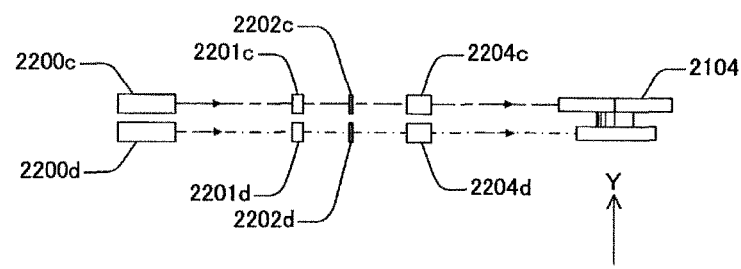
FIG. 4 is a third diagram of the optical scanning device of the color printer shown in FIG. 1.
Figure 5:
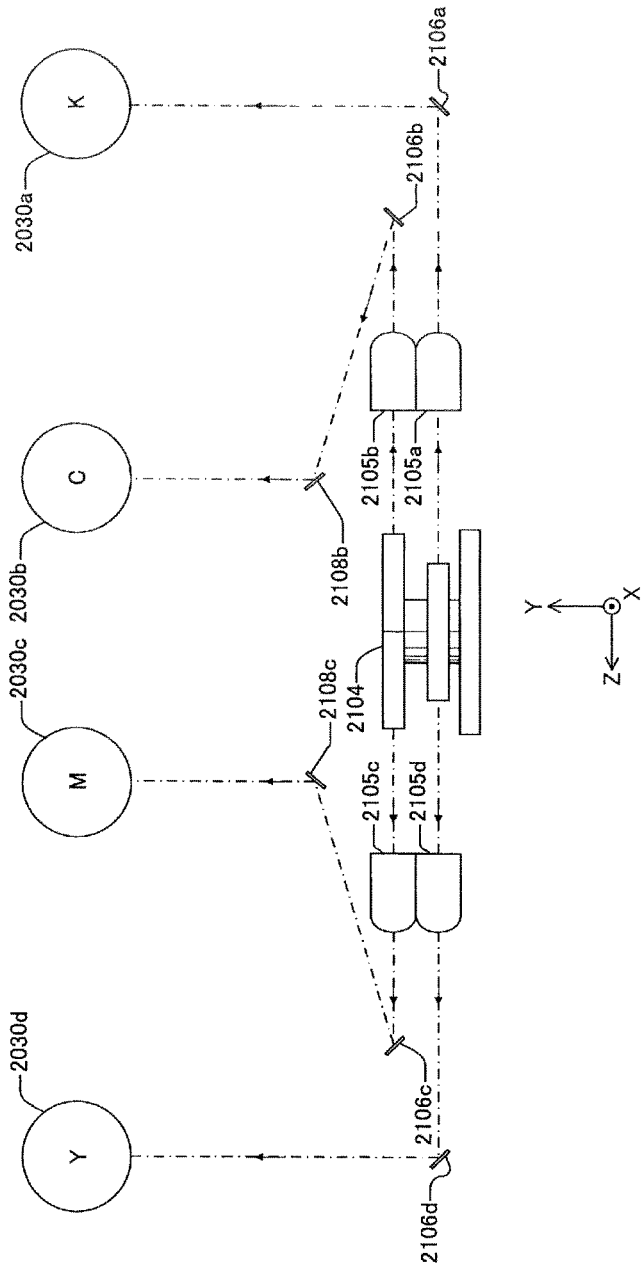
FIG. 5 is a fourth diagram of the optical scanning device of the color printer shown in FIG. 1.

FIG. 1 is a diagram showing an overall configuration of a color printer 2000 according to an embodiment of the present invention.

The color printer 2000 is a tandem-type multicolor printer that forms a full color image by superposing four colors (black, cyan, magenta, and yellow). The color printer 2000 includes an optical scanning device 2010, four photosensitive drums 2030a-2030d, four cleaning units 2031a-2031d, four charging devices 2032a-2032d, four developing rollers 2033a-2033d, four toner cartridges 2034a-3034d, a transfer belt 2040, a transfer roller 2042, a fixing device 2050, a paper feed collar 2054, a pair of resist rollers 2056, paper delivery rollers 2058, a paper feed tray 2060, a paper delivery tray 2070, a communication control apparatus 2080, and a printer control apparatus 2090 that performs overall control operations of the above units, for example.

It is noted that in a XYZ three-dimensional coordinate system, the X-axis direction represents the longitudinal direction of the photosensitive drums 2030a-2030d, and the Z-axis direction represents the direction along which the photosensitive drums 2030a-2030d are aligned.

The communication control apparatus 2080 controls bidirectional communications between the color printer 2000 and an upper apparatus (e.g., personal computer) via a network, for example.

The printer control apparatus 2090 may include a CPU, a ROM that stores programs described in code that is readable by the CPU and various types of data used for executing the programs, a RAM that is used as a working memory, and an AD conversion circuit that converts analog data into digital data, for example. The printer control apparatus 2090 transmits multicolor image information (black image information, cyan image information, magenta image information, and yellow image information) that is received from the upper apparatus via the communication control apparatus 2080 to the optical scanning device 2010.

The photosensitive drum 2030a, the charging device 2032a, the developing roller 2033a, the toner cartridge 2034a, and the cleaning unit 2031a are used as an image forming station for forming a black image (also referred to as "K station" hereinafter).

The photosensitive drum 2030b, the charging device 2032b, the developing roller 2033b, the toner cartridge 2034b, and the cleaning unit 2031b are used as an image forming station for forming a cyan image (also referred to as "C station" hereinafter).

The photosensitive drum 2030c, the charging device 2032c, the developing roller 2033c, the toner cartridge 2034c, and the cleaning unit 2031c are used as an image forming station for forming a magenta image (also referred to as "M station" hereinafter).

The photosensitive drum 2030d, the charging device 2032d, the developing roller 2033d, the toner cartridge 2034d, and the cleaning unit 2031d are used as an image forming station for forming a yellow image (also referred to as "Y station" hereinafter).

The photosensitive drums 2030a-2030d (simply referred to as "photosensitive drum 2030" hereinafter) have a photosensitive layer formed on their surface. The surface of the photosensitive drum 2030 corresponds to a scanning surface. It is noted that the photosensitive drum 2030 may be rotated in the direction of the arrows shown in FIG. 1 by a rotating mechanism (not shown).

The charging devices 2032a-2032d (simply referred to as "charging device 2032" hereinafter) are configured to evenly charge the surface of their corresponding photosensitive drums 2030.

The optical scanning device 2010 scans a light beam corresponding to each color that is modulated based on multicolor image information from the printer control apparatus 2090 on the surface of the corresponding photosensitive drum 2030 that is charged. In this way, electrical charges disappear from portions of the surface of the photosensitive drum 2030 that have been irradiated with light, and a latent image corresponding to the image information may be formed on the surface of the corresponding photosensitive drum 2030. The latent image formed in this manner is moved in the direction towards a developing device through the rotation of the photosensitive drum 2030. It is noted that the configuration of the optical scanning device 2010 is described below.

The developing rollers 2033a-2033d (simply referred to as "developing roller 2033" hereinafter) are configured to rotate to have toner from the corresponding toner cartridge 2034a-3034d (simply referred to as "toner cartridge 2034" hereinafter) evenly applied on their surfaces. When the developing roller 2033 comes into contact with its corresponding toner cartridge 2034, the toner on the developing roller 2030 is transferred and adhered to the portion of the surface of the photosensitive drum 2030 that is irradiated by light. That is, the developing roller 2033 develops the latent image formed on the corresponding photosensitive drum 2030 into a toner image by adhering toner on the surface of the photosensitive drum 2030. The toner image formed on the surface of the photosensitive drum 2030 is moved towards the transfer belt 2040 through the rotation of the photosensitive drum 2030.

Toner images in the colors yellow, magenta, cyan, and black are successively transferred onto the transfer belt 2040 at predetermined timings so that the toner images are superposed to form a color image.

The paper feed tray 2060 accommodates recording paper. The paper feed collar 2054 is arranged in the vicinity of the paper feed tray 2060 and the paper feed collar 2054 retrieves the recording paper one sheet at a time from the paper feed tray 2060 and transports the recording paper to the pair of resist rollers 2056. The resist rollers 2056 deliver the recording paper between the transfer belt 2040 and the transfer roller 2042 at a predetermined timing. In this way, the color image on the transfer belt 2040 may be transferred to the recording paper. The recording paper having the color image transferred thereon is then transported to the fixing device 2050.

The fixing device 2050 applies pressure and heat to the recording paper so that the toner forming the color image may be fixed on the recording paper. The recording image having the toner fixed thereon is delivered to the paper delivery tray 2070 via the paper delivery rollers 2058. In this way, sheets of recording paper having color images recorded thereon may be successively delivered and stacked on the paper delivery tray 2070.

The cleaning units 2031a-2031d (simply referred to as "cleaning unit 2031" hereinafter) are configured to remove residual toner remaining on the surfaces of their corresponding photosensitive drums 2030. The surface of the photosensitive drum 2030 that has been cleaned by the cleaning unit 2031 moves back to a position facing the corresponding charging device 2032.

In the following, the configuration of the optical scanning device 2010 is described. FIGS. 2-5 are diagrams showing an exemplary configuration of the optical scanning device 2010.

As is shown in FIGS. 2-5, the optical scanning device 2010 may include four light sources 2200a-2200d, four coupling lenses 2201a-2201d, four aperture plates 2202a-2202d, four cylindrical lenses 2204a-2204d, an optical deflector 2104, four scanning lenses 2105a-2105d, six reflection mirrors 2106a-2106d, 2108b, 2108c, and a scanning control apparatus (not shown), for example.

It is noted that in the following descriptions, a direction corresponding to a main scanning direction is referred to as "main scanning corresponding direction," and a direction corresponding to a sub scanning direction is referred to as "sub scanning corresponding direction."

The light source 2202a, the coupling lens 2201a, the aperture plate 2202a, the cylindrical lens 2204a, the scanning lens 2105a, and the reflection mirror 2106a correspond to an optical member for forming a latent image on the photosensitive drum 2030a.

The light source 2202b, the coupling lens 2201b, the aperture plate 2202b, the cylindrical lens 2204b, the scanning lens 2105b, the reflection mirror 2106b, and the reflection mirror 2108b correspond to an optical member for forming a latent image on the photosensitive drum 2030b.

The light source 2202c, the coupling lens 2201c, the aperture plate 2202c, the cylindrical lens 2204c, the scanning lens 2105c, the reflection mirror 2106c, and the reflection mirror 2108c correspond to an optical member for forming a latent image on the photosensitive drum 2030c.

The light source 2202d, the coupling lens 2201d, the aperture plate 2202d, the cylindrical lens 2204d, the scanning lens 2105d, and the reflection mirror 2106d correspond to an optical member for forming a latent image on the photosensitive drum 2030d.

The coupling lenses 2201a-2201d are arranged along the optical paths of the light beams emitted from of the corresponding light sources 2200a-2200d and are configured to arrange the corresponding light beams into substantially parallel light beams.

The aperture plates 2202a-2202d have apertures and are configured to shape the light beams passing through the corresponding coupling lenses 2201a-2201d.

The cylindrical lenses 2204a-2204d are configured to focus the optical beams passing through the apertures of the corresponding aperture plates 2202a-2202d in the Y-axis direction near the deflection surface of the optical deflector 2104.

The optical deflector 2104 has polygon mirrors arranged into a two-tier structure. The polygon mirrors each have four deflection surfaces. The polygon mirror at the first tier (lower tier) is arranged to deflect the light beam from the cylindrical lens 2204a and the light beam from the cylindrical lens 2204d. The polygon mirror at the second tier (upper tier) is arranged to deflect the light beam from the cylindrical lens 2204b and the light beam from the cylindrical lens 2204c. The first-tier polygon mirror and the second-tier polygon mirror are arranged to have a phase difference of approximately 45 degrees with respect to each other and are configured to rotate at a constant angular speed so that light beams may be alternately deflected and projected by the first-tier polygon mirror and the second-tier.

The light beam from the cylindrical lens 2204a that is deflected by the optical deflector 2104 is irradiated on the photosensitive drum 2030a via the scanning lens 2105a and the reflection mirror 2106a to form a light spot. The light spot moves in the longitudinal direction of the photosensitive drum 2030a as the optical deflector 2104 rotates.

The light beam from the cylindrical lens 2204b that is deflected by the optical deflector 2104 is irradiated on the photosensitive drum 2030b via the scanning lens 2105b and the reflection mirrors 2106b, 2108b to form a light spot. The light spot moves in the longitudinal direction of the photosensitive drum 2030b as the optical deflector 2104 rotates.

The light beam from the cylindrical lens 2204c that is deflected by the optical deflector 2104 is irradiated on the photosensitive drum 2030c via the scanning lens 2105c and the reflection mirrors 2106c, 2108c to form a light spot. The light spot moves in the longitudinal direction of the photosensitive drum 2030c as the optical deflector 2104 rotates.

The light beam from the cylindrical lens 2204d that is deflected by the optical deflector 2104 is irradiated on the photosensitive drum 2030d via the scanning lens 2105d and the reflection mirror 2106d to form a light spot. The light spot moves in the longitudinal direction of the photosensitive drum 2030d as the optical deflector 2104 rotates.

It is noted that the moving direction of the light spot corresponds to the main scanning direction and the rotating direction of the photosensitive drums 2030 corresponds to the sub scanning direction.

It is noted that an optical system arranged along the optical path between the optical deflector 2104 and the photosensitive drum 2030 may be referred to as "scanning optical system."

Figure 6:
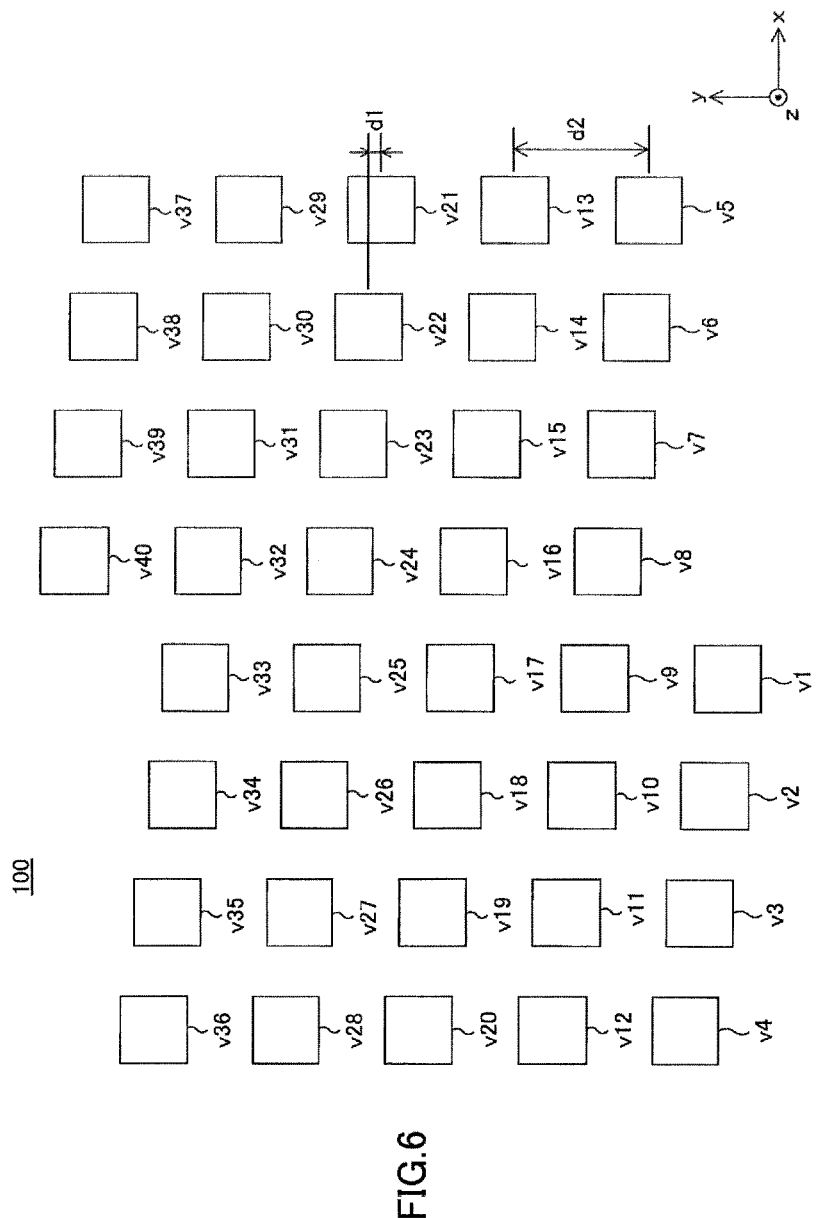
FIG. 6 is a diagram showing an exemplary arrangement of plural light emitting units of a surface emitting laser array according to an embodiment of the present invention.

The light sources 2200a-2200d may each include a surface emitting laser array 100 as is shown in FIG. 6 that has forty light emitting units v1-v40 arranged into a two-dimensional array, for example. In FIG. 6, the z-axis direction represents a laser oscillation direction, and the x-axis direction and the y-axis direction represent two orthogonal directions that intersect at right angles on a plane that is perpendicular to the z-axis direction. The x-axis direction corresponds to the main scanning corresponding direction, and the y-axis direction corresponds to the sub scanning corresponding direction. It is noted that although not shown in FIG. 6, forty electrode pads are arranged for the forty light emitting units v1-v40 and corresponding wiring members for establishing electrical connection between the light emitting units v1-v40 and the electrode pads are arranged.

In FIG. 6, the forty light emitting units v1-v40 are arranged in a manner such that when the light emitting units v1-v40 are projected orthographically along a virtual line extending in the y-axis direction, the light emitting units v1-v40 are spaced apart at equal distances of d1 along the virtual line. That is, d1 represents the distance between the centers of two adjacent light emitting units projected along the virtual line. Also, d2 represents the pitch of the light emitting units. It is noted that although forty light emitting units v1-v40 are used in the example shown in FIG. 6, the present invention is not limited to such a configuration.

Figure 7:
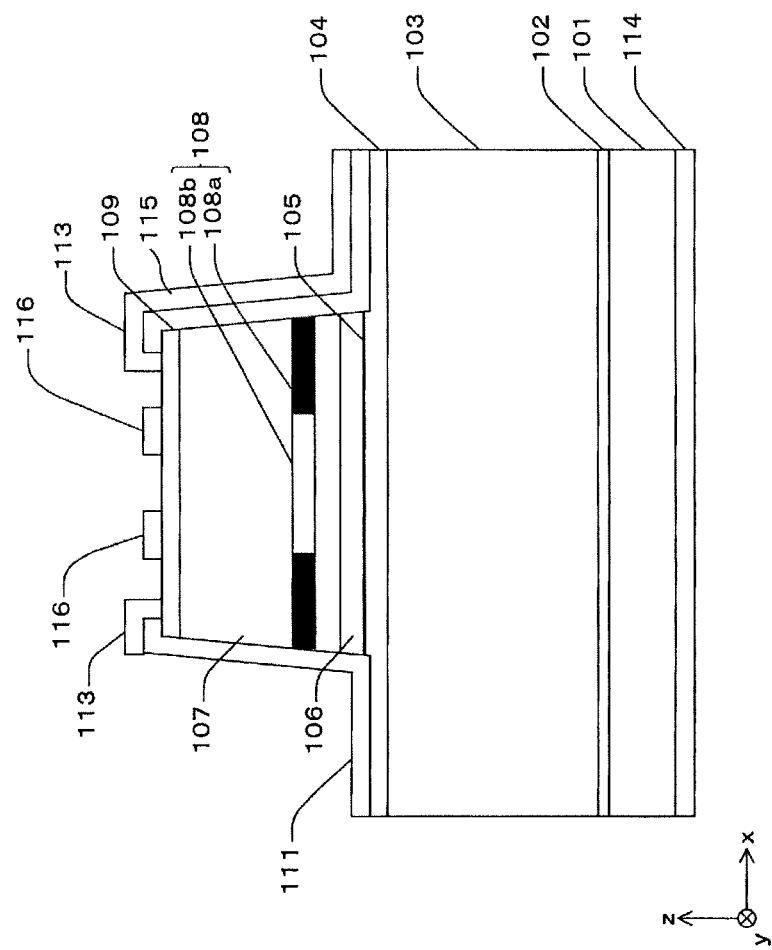
FIG. 7 is a diagram showing an exemplary configuration of the light emitting unit of the surface emitting laser array.

FIG. 7 is a cross-sectional view of the light emitting unit from a section parallel to the x-z plane.

It is noted that each of the light emitting units v1-v40 of FIG. 6 may be arranged to have the configuration shown in FIG. 7, for example. The light emitting unit shown in FIG. 7 may correspond to a surface emitting laser having an oscillation wavelength in the 780 nm band, for example. The light emitting unit may include a substrate 101, a buffer layer 102, a lower semiconductor DBR (Distributed Bragg Reflector) 103, a lower spacer layer 104, an active layer 105, an upper spacer layer 106, an upper semiconductor DBR 107, an upper electrode 113, a lower electrode 114, a wiring member 115, and a dielectric layer 116, for example.

As is shown in FIGS. 8A and 8B, the substrate 101 may correspond to a single crystal n-GaAs substrate having a mirror polished surface that is arranged so that the normal direction of the mirror polished surface (main surface) is tilted at a tilt angle of 15 degrees ($\theta$=15 degrees) towards one direction A of crystal orientation [1 1 1]. That is, the substrate 101 corresponds to a so-called tilted substrate. In the present example, the substrate 101 is disposed in a manner such that the direction of crystal orientation [0 –1, 1] corresponds to the +x direction and the direction of crystal orientation [0 1 –1] corresponds to the –x direction.

Referring back to FIG. 7, the buffer layer 102 is arranged on the +z side surface of the substrate 101 and corresponds to a n-GaAs layer.

The lower semiconductor DBR 103 is arranged on the +z side surface of the buffer layer 102 and includes 40.5 pairs of a low refractive index layer made of n-AlAs and a high refractive index layer made of n-$Al_{0.3}Ga_{0.7}As$. Each of the refractive index layers are arranged so that its optical thickness is equal to one-fourth of its oscillation wavelength $\lambda$ ($\lambda/4$). It is noted that when the optical thickness is $\lambda/4$, the actual thickness of the layer is equal to $\lambda/4n$ (where n represents the refractive index of the medium of the corresponding layer).

The lower spacer layer 104 is arranged on the +z side surface of the lower semiconductor DBR 103 and corresponds to a non-doped $(Al_{0.1}Ga_{0.9})_{0.5}In_{0.5}P$ layer.

The active layer 105 is arranged on the +z side surface of the lower spacer layer 104 and has a GaInAsP/GaInP triple quantum well structure. Each quantum well layer is made of GaInAsP corresponding to a composition that induces a 0.7% compression strain, and each barrier layer is made of GaInP corresponding to a composition that induces a 0.6% extensional strain.

The upper spacer layer 106 is arranged on the +z side surface of the active layer 105 and corresponds to a non-doped $(Al_{0.1}Ga_{0.9})_{0.5}In_{0.5}P$ layer.

It is noted that the lower spacer layer 104, the active layer 105, and the upper spacer layer 106 may collectively be referred to as "resonator structure." The optical thickness of the resonator structure is arranged to be equal to one optical wavelength of the resonator structure. It is noted that the active layer 105 is arranged at the center of the resonator structure corresponding to the position of an anti-node of the standing wave distribution of the electric field of light so that a high stimulated emission rate may be achieved.

The upper semiconductor DBR 107 includes a first upper semiconductor DBR and a second upper semiconductor DBR. The first upper semiconductor DBR is arranged on the +z side of the upper spacer layer 106 and includes a pair of a low refractive index layer made of p-$(Al_{0.7}Ga_{0.3})_{0.5}In_{0.5}P$ and a high refractive index layer made of p-$(Al_{0.7}Ga_{0.9})_{0.5}In_{0.5}P$.

The second upper semiconductor DBR is arranged on the +z side of the first upper semiconductor DBR and includes 23 pairs of a low refractive index layer made of p-$Al_{0.9}Ga_{0.1}As$ and a high refractive index layer made of p-$Al_{0.3}Ga_{0.7}As$.

The optical thickness of each of the refractive index layers of the upper semiconductor DBR 107 is arranged to be equal to λ/4 (one-fourth of the optical wavelength λ).

One of the low refractive index layers of the second upper semiconductor DBR has a selectively-oxidized layer made of p-AlAs with a thickness of 30 nm inserted therein.

The selectively-oxidized layer is inserted at a position corresponding to the third node from the active layer 105 of the standing wave distribution of the electric field of light.

The contact layer 109 is arranged on the +z side of the second upper semiconductor DBR and is made of p-GaAs.

Figure 9:
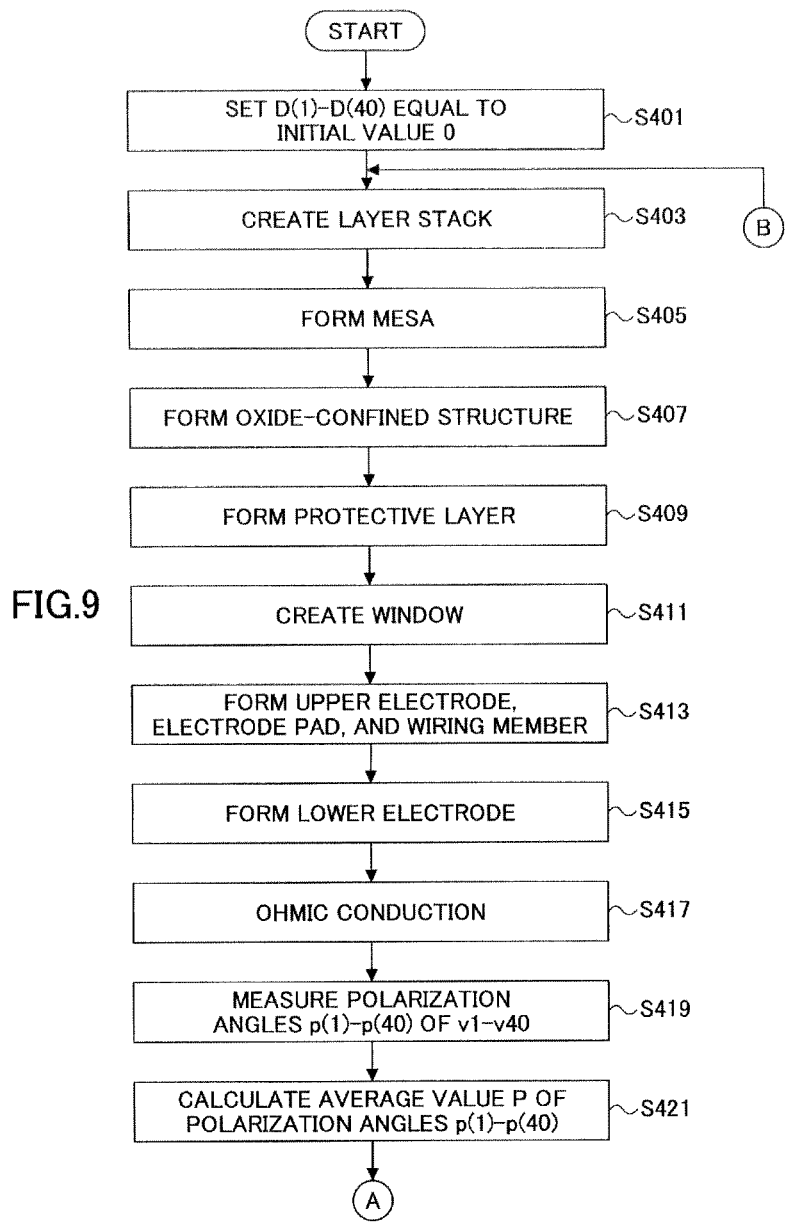
FIG. 9 is a first flowchart showing exemplary process steps of a design data obtaining process for the surface emitting laser array.
Figure 10:
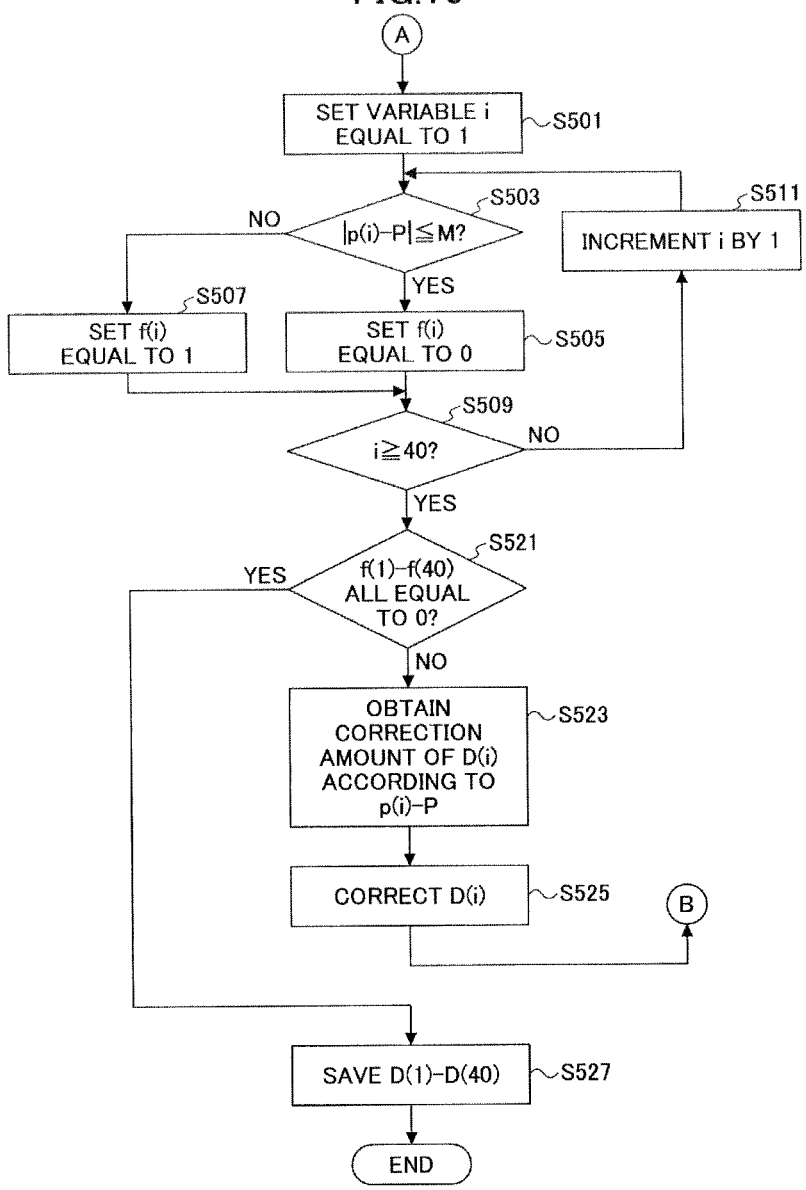
FIG. 10 is a second flowchart showing exemplary process steps of the design data obtaining process for the surface emitting laser array.

In the following, process steps for obtaining design data related to the wiring positions of the wiring members of the surface emitting laser array 100 (referred to as "design data obtaining process" hereinafter) are described with reference to FIGS. 9 and 10. FIGS. 9 and 10 are flowcharts representing an exemplary sequence of process algorithms that may be executed by a control apparatus of a system for manufacturing the surface emitting laser array 100. The control apparatus may include a microcontroller, a memory (e.g., ROM, RAM), an input device, and a display device, for example.

Figure 11:
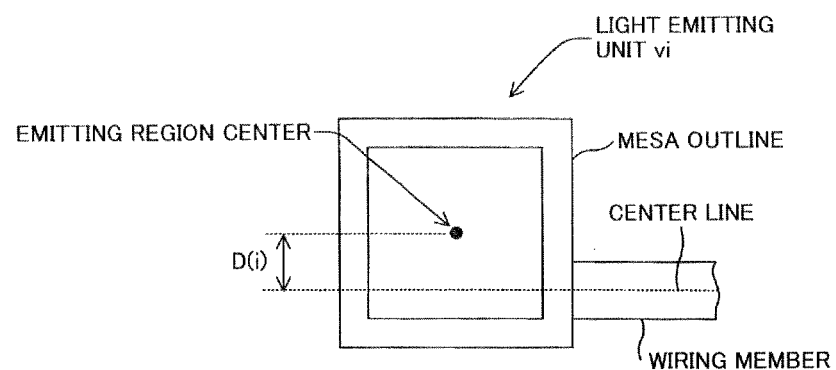
FIG. 11 is a diagram showing the distance between the center of the light emitting unit and the center line of a wiring member.

It is noted that in the following descriptions, the substrate 101 having plural semiconductor layers arranged thereon may also be referred to as "layer stack." Also, as is shown in FIG. 11, the distance between the center of an emitting region of the light emitting unit and the center line of the wiring member extending from the light emitting unit is denoted as D(i) (i=1-40).

Referring to FIG. 9, in step S401, the values of D(1)-D(40) are set equal to the initial value 0.

Figure 12:
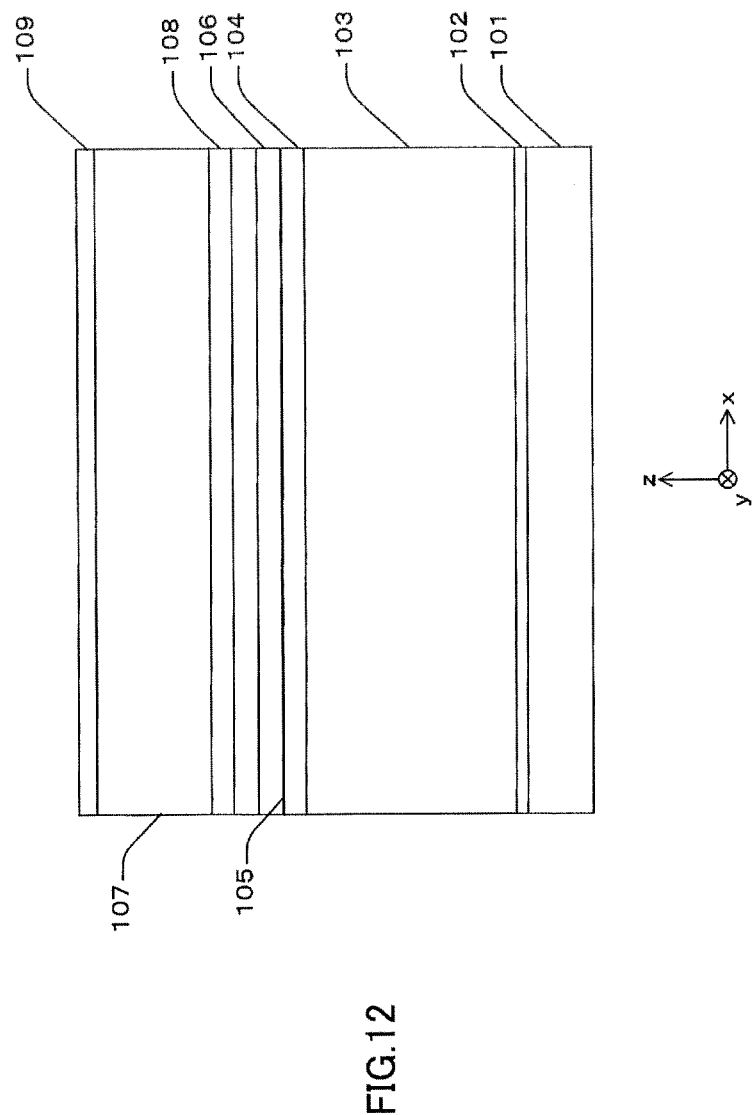
FIG. 12 is a diagram illustrating step S403 of the design data obtaining process for the surface emitting laser array.

Then, in step S403, the layer stack is created by crystal growth using metal-organic chemical vapor deposition (MOCVD) or molecular beam epitaxy (MBE) (see FIG. 12).

In the case where MOCVD is used, trymethylaluminum (TMA), trymethylgallium (TMG), and/or trymethylindium (TMI) may be used as the group III component material, and phosphine (PH3) and/or arsine ($AsH_3$) may be used as the group V component material. Also, carbon tetrabromide ($CBr_4$) and/or dimethylzinc (DMZn) may be used as the p-type dopant material, and hydrogen selenide ($H_2Se$) may be used as the n-type dopant material.

Then, in step S405, quadrilateral resist patterns are formed at plural regions of the layer stack surface corresponding to where the light emitting units v1-v40 are to be formed. In the present example, square-shaped resist patterns each having a side length of 25 μm are formed. It is noted that one side of the square shape of the resist patterns is arranged to be parallel to the tilt axis of the substrate 101.

Then, ECR etching using $Cl_2$ gas is performed to form a square prism mesa structure (referred to as "mesa" hereinafter) using the resist pattern as a photo mask. In the present example, the bottom face of the etched structure is arranged to be within the lower spacer layer 104.

Figure 13:
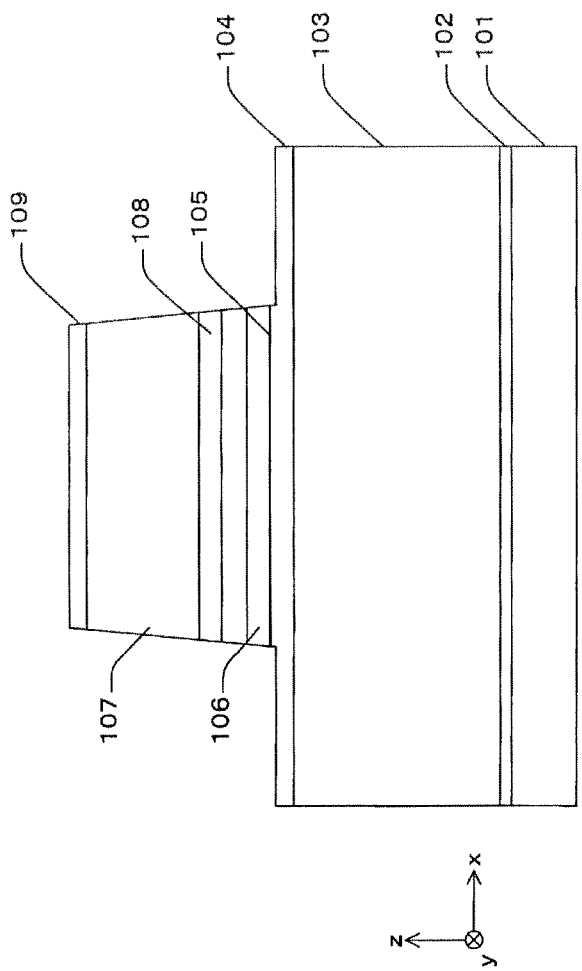
FIG. 13 is a diagram illustrating step S405 of the design data obtaining process for the surface emitting laser array.

Then, the photo mask is removed (see FIG. 13).

Figure 14:
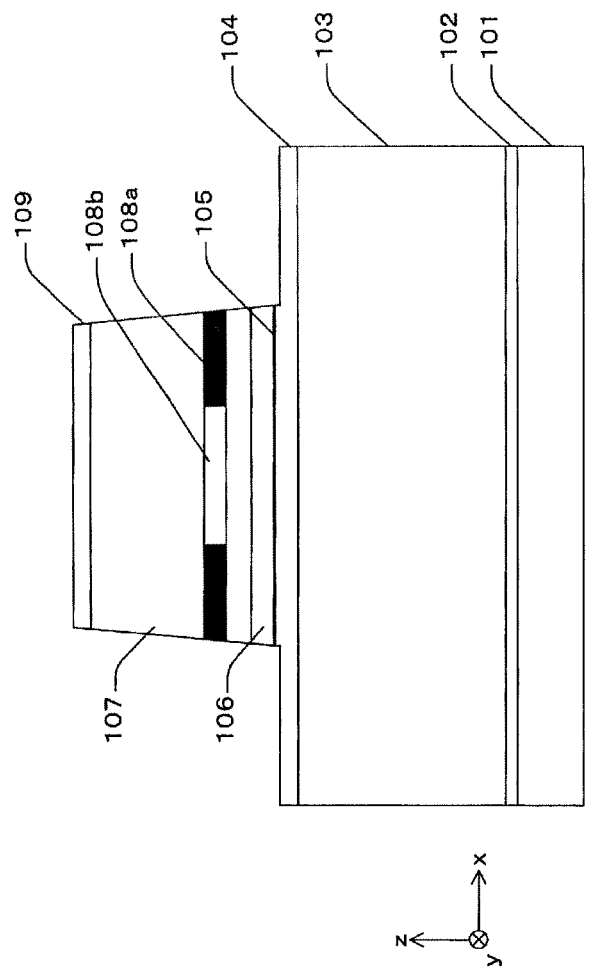
FIG. 14 is a diagram illustrating step S407 of the design data obtaining process for the surface emitting laser array.

Then, in step S407, the layer stack is heat-process in a water vapor. In this way, the p-AlAs layer in the selectively-oxidized layer is selectively oxidized from the outer periphery of the mesa to form an insulating region 108a made of a $Al_xAs_yO_z$ layer. Also, a non-oxidized region 108b surrounded by the insulating region 108a remains at the center portion of the mesa (see FIG. 14). That is, a so-called oxide-confined structure is formed to restrict the path of the drive current of the light emitting unit to the center portion of the mesa. The non-oxidized region 108b corresponds to a current passage region. In the present example, a square-shaped current passage region with a side length of 4-6 μm is formed. It is noted that one side of the square-shaped current passage region is arranged to be parallel to the tilt axis of the substrate 101.

Figure 15:
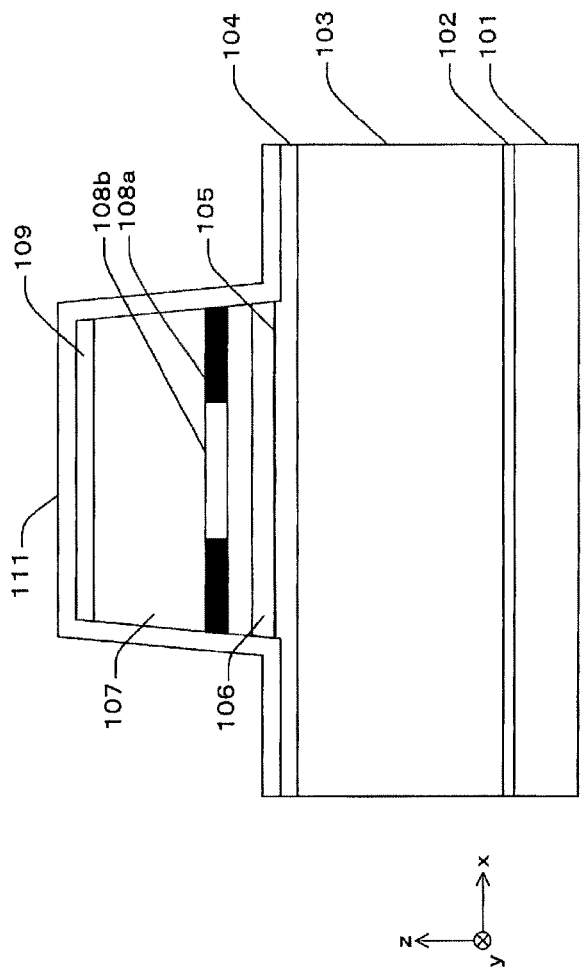
FIG. 15 is a diagram illustrating step S409 of the design data obtaining process for the surface emitting laser array.

Then, in step S409, chemical vapor deposition (CVD) is used to form a protective layer 111 made of SiN over the entire surface of the layer stack (see FIG. 15). In the present example, the optical thickness of the protective layer 111 is arranged to be λ/4n. In this case, since λ=780 nm and n=1.86, the actual film thickness of the protective layer 111 is approximately 105 nm.

Figure 16:
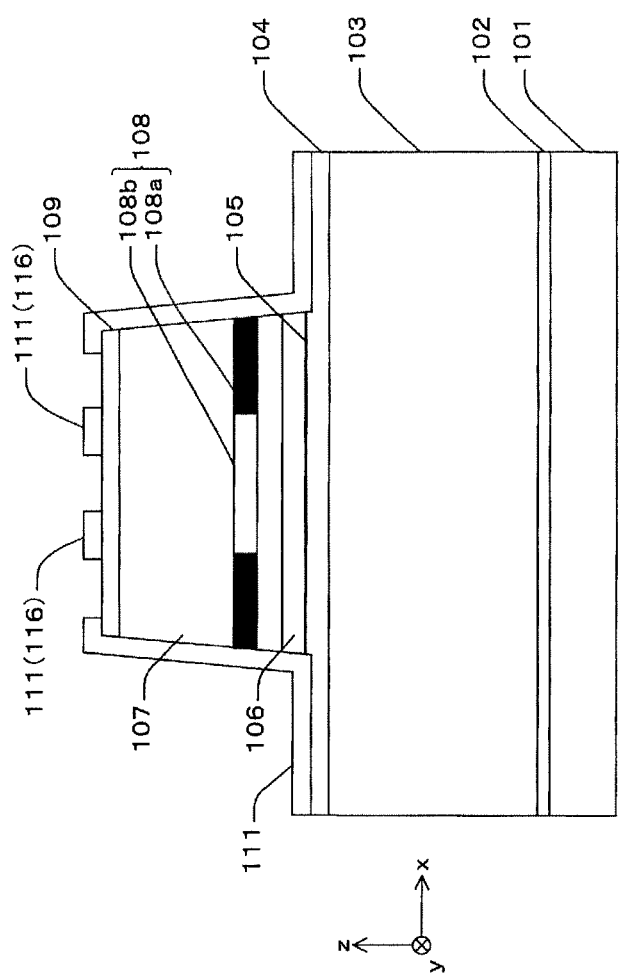
FIG. 16 is a diagram illustrating step S411 of the design data obtaining process for the surface emitting laser array.

Then, in step S411, resist patterning and BHF (buffered HF) etching processes are performed to create windows by removing portions of the protective layer 111 corresponding to a contact region of the upper electrode 113 and a high reflectivity region within a region that is to become an opening for the upper electrode 113 (see FIG. 16). It is noted that the portions of the protective layer 111 remaining on the region that is to become the opening for the upper electrode 113 corresponds to the dielectric layer 116.

Figure 17:
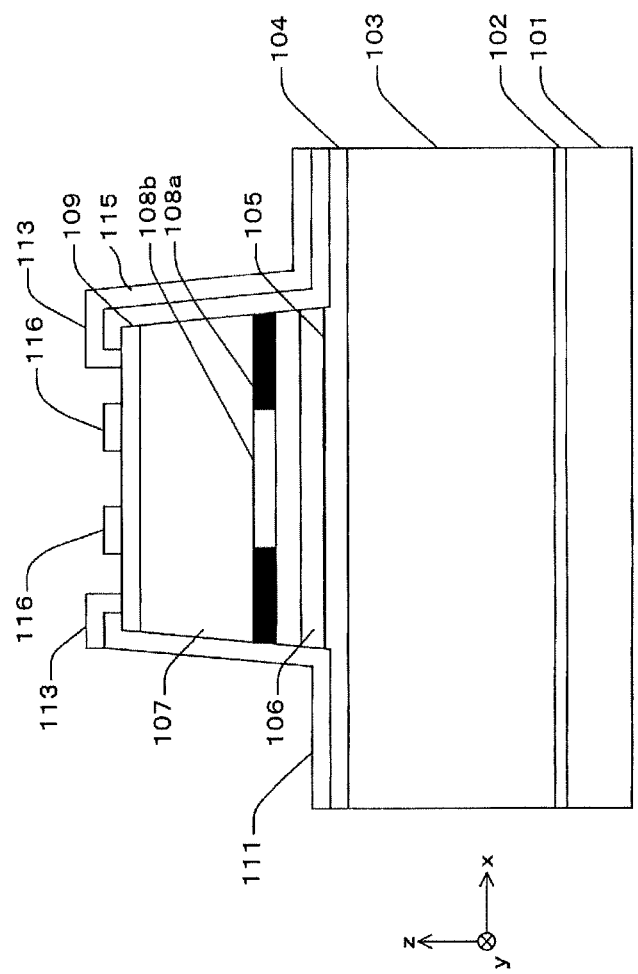
FIG. 17 is a diagram illustrating step S413 of the design data obtaining process for the surface emitting laser array.

Then, in step S413, resist patterning, electrode vapor deposition, and liftoff processes are performed to form the upper electrode 113, the electrode pad, and the siring member 115 (see FIG. 17). It is noted that in the resist patterning process, the position of the wiring member 115 with respect to its corresponding light emitting unit vi (v1-v40) is determined based on the value of D(i) (D(1)-D(40)).

It is noted that a Cr/AuZn/Au multilayer film or a Ti/Pt/Au multilayer film may be used as the material for forming the upper electrode 113, the electrode pad, and the wiring member 115.

Figure 18:
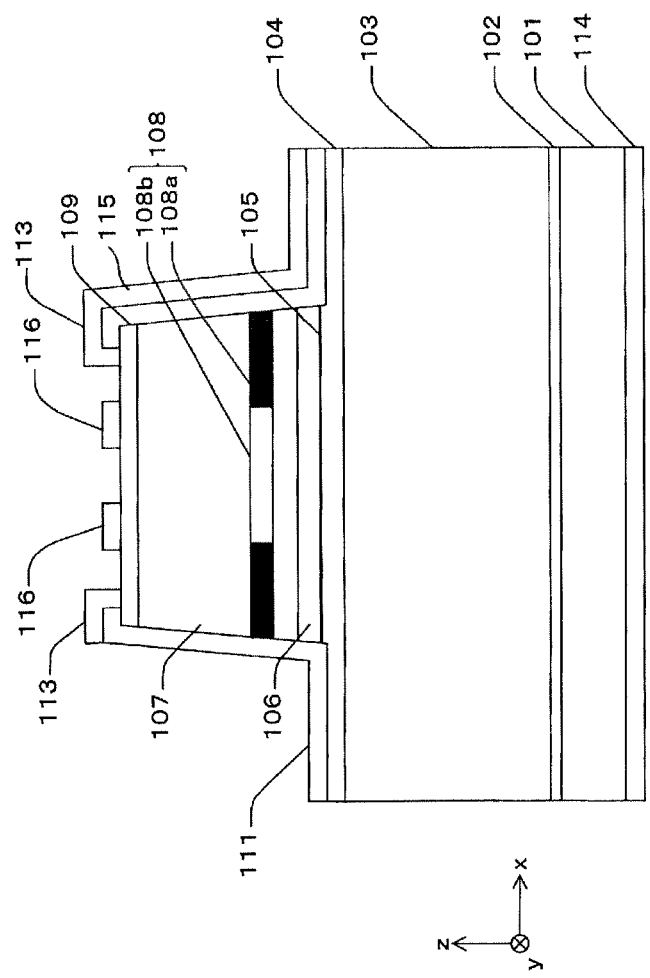
FIG. 18 is a diagram illustrating step S415 of the design data obtaining process for the surface emitting laser array.

Then, in step S415, after polishing the rear face of the substrate 101 to a predetermined thickness (e.g., approximately 100 nm), the lower electrode 114 is formed on the rear face of the substrate 101 (see FIG. 18). In the present example, the lower electrode 114 is made of an AuGe/Ni/Au multilayer film.

Then, in step S417, an annealing process is performed to realize ohmic conduction between the upper electrode 113 and the lower electrode 114. In this way, the mesa becomes the light emitting unit. Then, the layer stack is cut into individual chips.

Then, in step S419, polarization angles p(1)-p(40) of the light emitting units v1-v40 are measured using a polarization angle measuring apparatus.

Then, in step S421, an average value P of the polarization angles p(1)-p(40) is calculated.

Then, referring to FIG. 10, in step S501, the variable i (i=1-40) is set equal to the initial value 1.

Then, in step S503, a determination is made as to whether the absolute value of the difference between p(i) and P is less than or equal to a predetermined value M. If the absolute value of the difference between p(i) and P is less than or equal to the predetermined value M, a positive determination is made (S503, Y), and the process moves on to step S505. It is noted that the predetermined value M may be set up and/or changed by an operator of the control apparatus via the input device. In the present example, it is assumed that M is set equal to 2 (M=2).

In step S505, a flag f(i) is set equal to 0 meaning "good."

Then, in step S509, a determination is made as to whether the variable i is greater than or equal to 40 corresponding to the number of light emitting units. If the variable i is less than 40, a negative determination is made (S509, N), and the process proceeds to step S511.

In step S511, the variable i is incremented by 1, and the process goes back to step S503.

The above process steps S503-S511 are repeated until a positive determination is made in step S509.

When it is determined in step S503 that the absolute value of the difference between p(i) and P is greater than M, a negative determination is made (S503, N), and the process proceeds to step S507.

In step S507, the flag f(i) is set equal to 1 meaning "bad," and the process proceeds to step S509.

When the value of the variable i reaches 40, a positive determination is made (S509, Y), and the process proceeds to step S521.

In step S521, a determination is made as to whether all the values of the flags f(1)-f(40) are set equal to 0. If one or more of the flags f(1)-f(40) are set equal to 1, a negative determination is made (S521, N), and the process proceeds to step S523.

In step S523, a correction amount (adjustment amount) for D(i) according to the difference between p(i) and P is obtained for each f(i) that is set equal to 1. The correction amount for D(i) may be determined by referring to a wiring member position correction table that is stored in a memory, for example.

Then, in step S525, the value of D(i) is corrected to the above correction amount, and the process goes back to step S403 of FIG. 9.

On the other hand, when it is determined in step S521 that all of the flags f(1)-f(40) are set equal to 0, a positive determination is made (S521, Y), and the process proceeds to step S527.

In step S527, the values of D(1)-D(40) are stored in a memory, and the design data obtaining process is ended.

Figure 19:
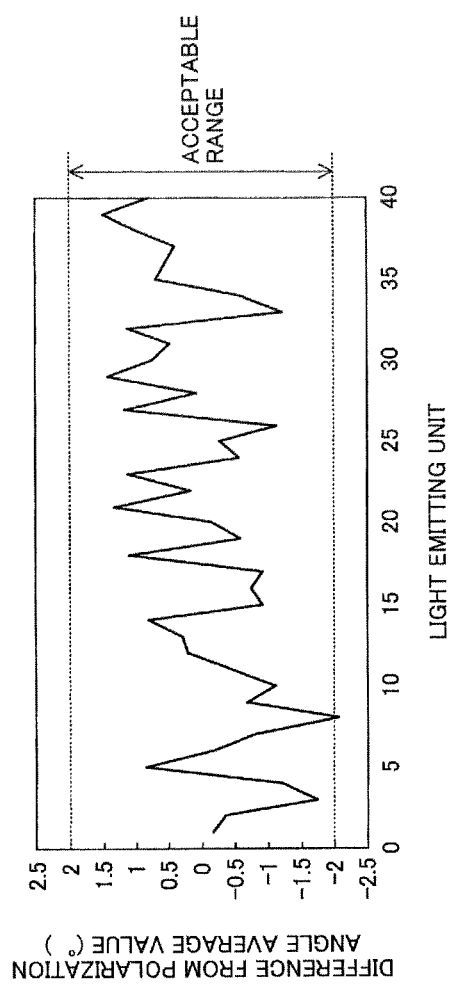
FIG. 19 is a graph showing exemplary variations in the polarization angles of plural light emitting units with respect to an average value of the polarization angles.
Figure 20:
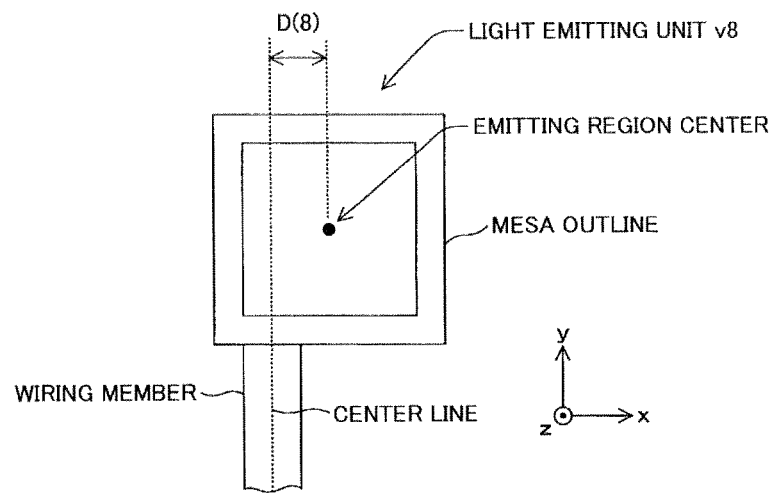
FIG. 20 is a diagram illustrating an exemplary manner of correcting the connection position of the wiring member.

FIG. 19 is a graph showing exemplary variations in the polarization angles of the light emitting units v1-v40 with respect to the average value P. That is, the vertical axis of FIG. 19 represents the difference between p(i) and P for each of the light emitting units v1-v40. In the example shown in FIG. 19, the absolute value of the difference between the polarization angle p(8) of the light emitting unit v8 and the average value P exceeds the predetermined value M=2. Since wiring members connected to other light emitting units are arranged at the +x side and −x side of the light emitting unit v8, the connection position of the wiring member for the light emitting unit v8 is adjusted with respect to the x-axis direction. For example, as is shown in FIG. 20, the distance D(8) for the light emitting unit v8 may be corrected to 5 μm, and the surface emitting laser array 100 may be manufactured once again using the corrected value. As a result, the difference between p(8) and P may be reduced to approximately 0.2 degrees, for example.

It is noted that the values of D(1)-D(40) obtained from the above design data obtaining process may be used for mass producing the surface emitting laser array 100, for example.

Upon examining plural mass-produced surface emitting laser arrays 100 manufactured using the above design data, it has been confirmed that the variations in the polarization angles of the plural light beams emitted from the surface emitting laser arrays 100 could be maintained within a range between −2 degrees and +2 degrees.

Figure 21:
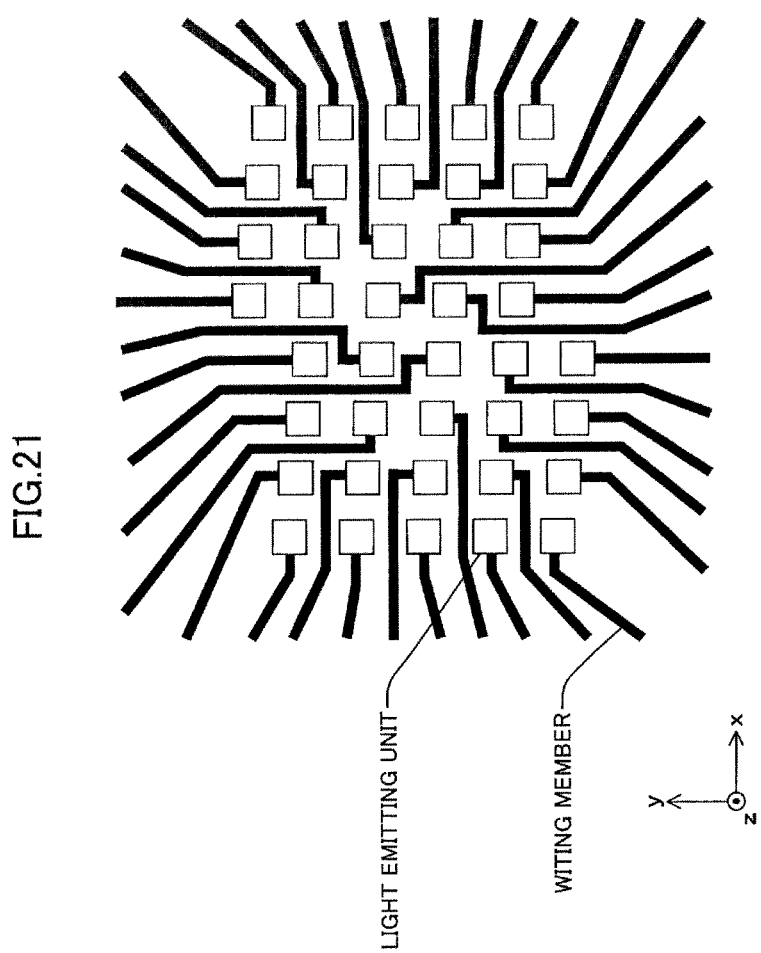
FIG. 21 is a diagram showing an exemplary arrangement of the light emitting units and the wiring members.
Figure 24A:
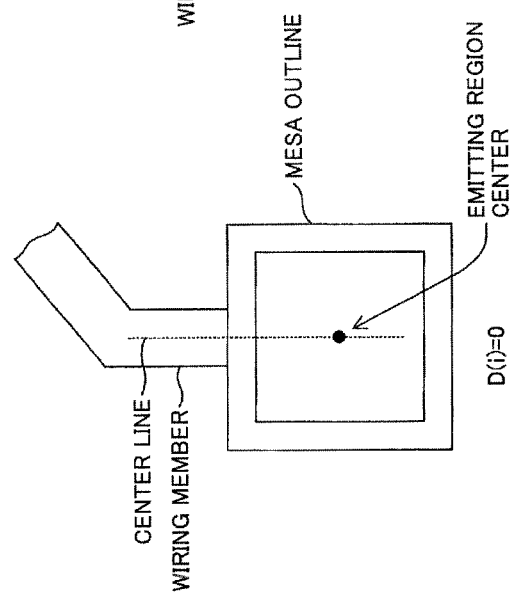
FIGS. 24A and 24B are diagrams showing third exemplary arrangements of the wiring member with respect to the light emitting unit.
Figure 24B:
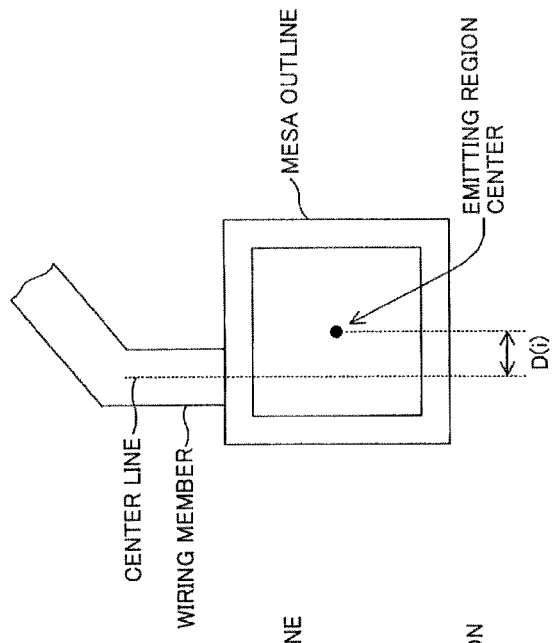

FIG. 21 is a diagram showing an exemplary arrangement of the forty light emitting units and their corresponding wiring members of the surface emitting laser array 100 that has been mass-produced. It is noted that the electrode pads are omitted in FIG. 21.

FIGS. 22A-24B show various exemplary arrangements of the wiring member with respect to the light emitting unit.

As can be appreciated, the surface emitting laser array 100 according to the present embodiment includes plural light emitting units each including the substrate 101, the buffer layer 102, the lower semiconductor DBR 103, the resonator structure, the upper semiconductor DBR 107, the upper electrode 113, the lower electrode 114, the wiring member 115, and the dielectric layer 116, for example.

According to an aspect of the present embodiment, before mass-producing the surface emitting laser array 100, the design data obtaining process is performed to obtain suitable values for D(1)-D(40) by adjusting the distance D(i) between the center of the light emitting unit and the center line of the corresponding wiring member so that the absolute value of the difference between the polarization angle of the light beam emitted from each light emitting unit and the average value of the polarization angles of the light beams emitted from the surface emitting laser array 100 may be less then or equal to a predetermined value. Further, before mass-producing the surface emitting laser array 100, the values of D(1)-D(40) obtained in the design data obtaining process are used to form the wiring members.

The inventors of the present invention have conducted various tests to find that when the connection position of the wiring member with respect to the corresponding light emitting unit is changed, the polarization angle of light emitted from the light emitting unit also changes, and the direction in which the polarization angle changes is related to the direction in which the connection position of the wiring member is changed.

Figure 25A:
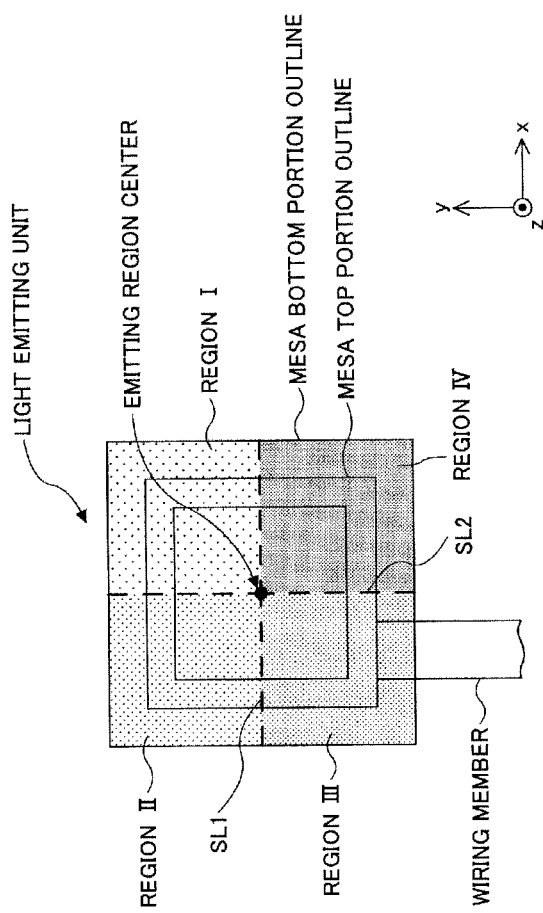
FIGS. 25A and 25B are diagrams showing the light emitting unit being divided into four regions.
Figure 25B:
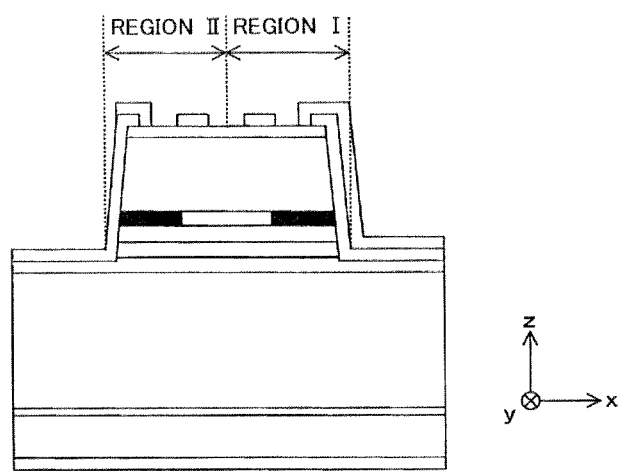

FIGS. 25A and 25B are diagrams illustrating an exemplary case in which the light emitting unit is divided into four regions (i.e., region I, region II, region III, and region IV) by two straight lines SL1 and SL2 passing through the center of the emitting region within a plane that is parallel to the substrate 101, one of the straight lines being parallel to the polarization direction and the other straight line being perpendicular to the polarization direction. In the present example, the straight line SL1 that is parallel to the x-axis direction is perpendicular to the polarization direction, and the straight line SL2 that is parallel to the y-axis direction is parallel to the polarization direction. It is noted that the regions I-IV each cover the surface portion of the mesa as well as the tilted side face portions of the mesa (see FIG. 25B).

Figure 26A:
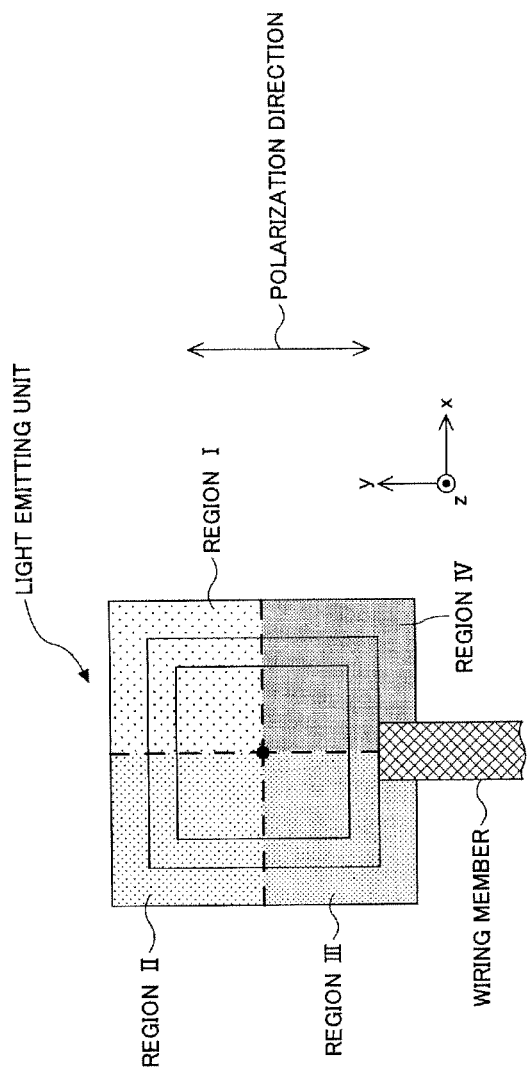

FIGS. 26A-26B illustrate an exemplary case in which the extending direction of the wiring member is parallel to the polarization direction and the connection position of the wiring member is moved in the −x direction. In this case, the area of the wiring member within region III is increased and the polarization direction is rotated clockwise.

Figure 27A:
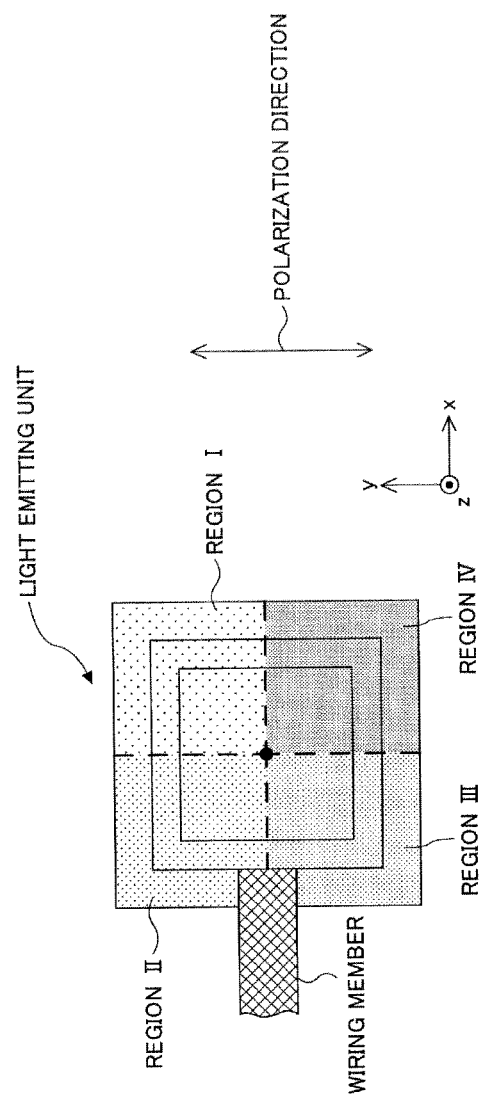

FIGS. 27A-27B illustrate an exemplary case in which the extending direction of the wiring member is perpendicular to the polarization direction and the connection position of the wiring member is moved in the +y direction. In this case, the area of the wiring member within region II is increased and the polarization direction is rotated counterclockwise.

As can be appreciated from above, regardless of whether the extending direction of the wiring member is parallel or perpendicular to the polarization direction, the polarization direction tends to rotate towards the region in which the area of the wiring member has increased. In one preferred embodiment, the direction in which D(i) is adjusted may be determined based on such tendency.

Figure 28:
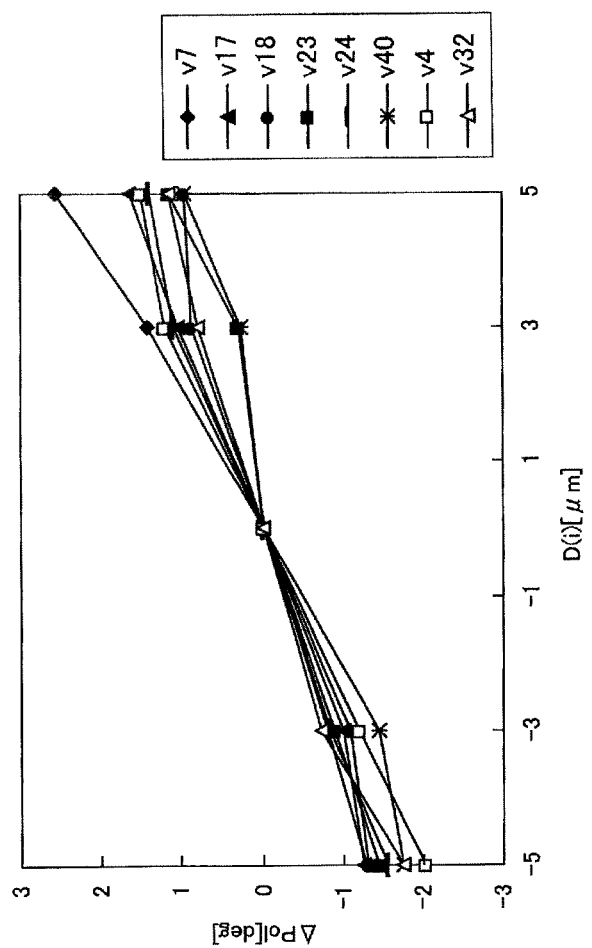
FIG. 28 is a graph showing the relationship between the distance between the centers of the light emitting unit and the wiring member and the rotation angle of the polarization direction of the light emitting unit.
Figure 29A:
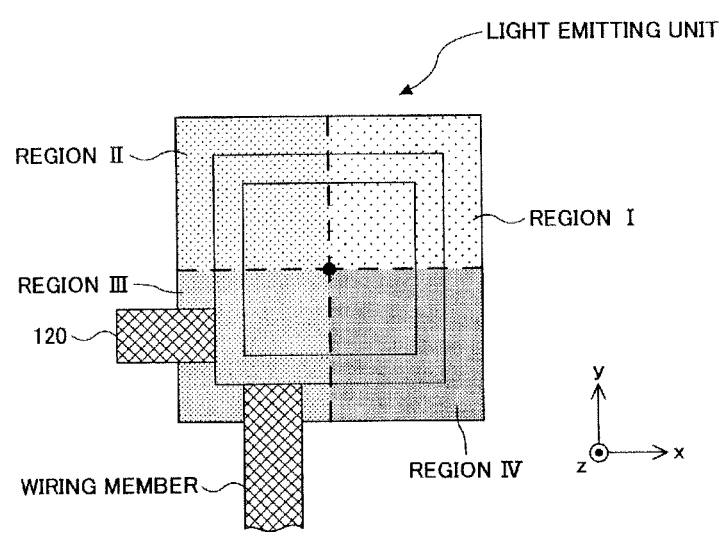
FIGS. 29A and 29B are a first set of diagrams showing exemplary connection positions of a metal member.
Figure 29B:
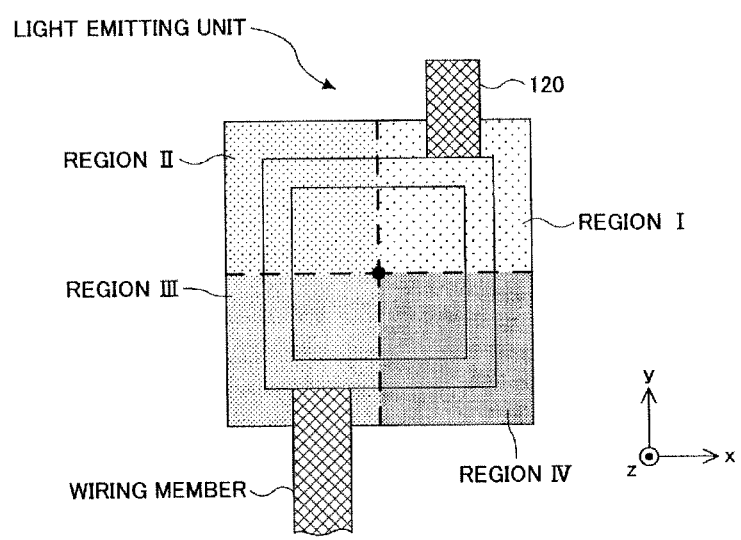

FIG. 28 shows experimental results obtained by varying the values of D(i) for the eight light emitting units v4, v7, v17, v18, v23, v24, v32, and v40 of the surface emitting laser array 100. In the present example, the clockwise rotating direction of the polarization direction is arranged to correspond to the positive direction of D(i), and the value of D(i) is arranged to vary from −5 (μm) to −3 (μm), 0 (μm), 3 (μm), and 5 (am).

FIG. 28 is a graph showing the relationship between the value of D(i) and the rotation angle of the polarization direction for each of the above eight light emitting units. It is noted that the vertical axis Δ Pol of FIG. 28 represents the rotation angle of the polarization direction with respect to the polarization direction when D(i)=0.

In the present example, the wiring members of six of the light emitting units v7, v17, v18, v23, v24, and v40 are extended in directions parallel to the polarization direction, and the wiring members of two of the light emitting units v4 and v32 are extended in directions perpendicular to the polarization direction.

It can be appreciated from FIG. 28 that the value of D(i) and the rotation angle of the polarization direction of have a nearly linear correlation such that when the value of D(i) is changed by 1 μm, the polarization direction changes by approximately 0.3 degrees. Also, it can be appreciated from FIG. 28 that the degree of rotation of the polarization direction in relation to the amount of change in the value of the D(i) is substantially the same regardless of whether the wiring member is extended in a direction parallel to the polarization direction or in a direction perpendicular to the polarization direction.

In one embodiment, a suitable adjustment amount for the value of D(i) may be approximated based on the above correlation.

It is noted that in a light emitting unit with a polarization angle p(i) that differs from the average value P by a relatively large amount, the difference between p(i) and P may be not be reduced to a desired value even when the value of D(i) is adjusted to the maximum limit for changing the connection position of the wiring member. In this case, as is shown in FIGS. 29A-30B, according to a preferred embodiment, in addition to adjusting the value of D(i), a metal member 120 may be connected to the region where the area of the wiring member is the greatest or the region positioned diagonally with respect to the region where the area of the wiring member is the greatest.

Figure 30A:
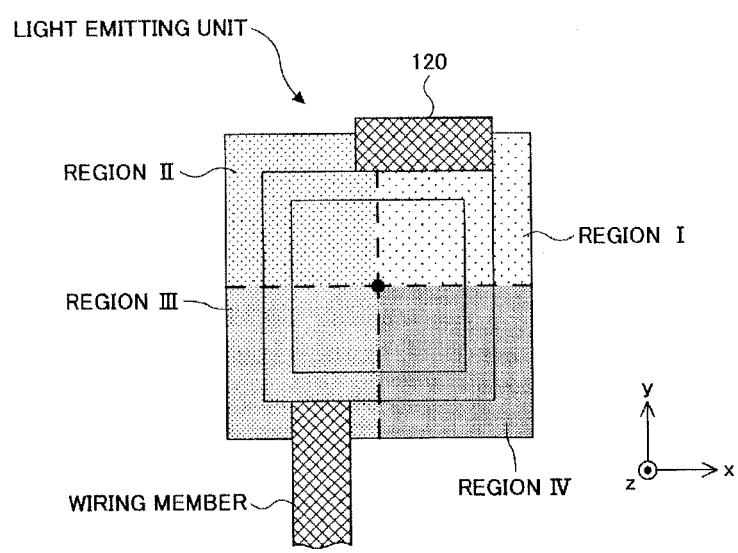
FIGS. 30A and 30B are a second set of diagrams showing exemplary connection positions of the metal member.
Figure 30B:
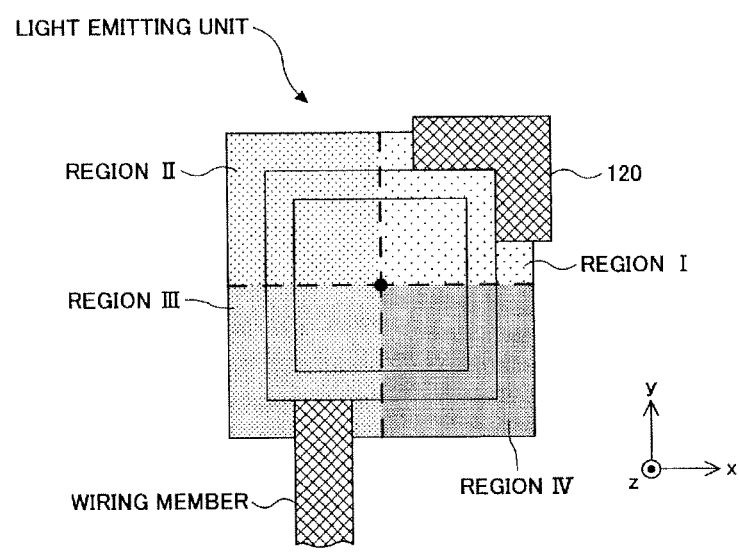

In the examples shown in FIGS. 29A-30B, since the region where the area of the wiring member is the greatest corresponds to region III, the metal member 120 may be connected to either region III or region I. In one example, as is shown in FIG. 30A, the metal member 120 may be connected across two regions (regions I and II in FIG. 30A) as long as a greater area portion of the metal member 120 is arranged in the region where the area of the wiring member is the greatest or the area positioned diagonally with respect to such region. In another example, as is shown in FIG. 30B, the metal member 120 may be connected to two sides of a region.

According to an aspect of the present embodiment, when a variation of the polarization angle of a light emitting unit cannot be adequately reduced by merely adjusting the connection position of the wiring member, the polarization angle of the light emitting unit may be adjusted to a desired polarization direction using the metal member 120.

Figure 31:
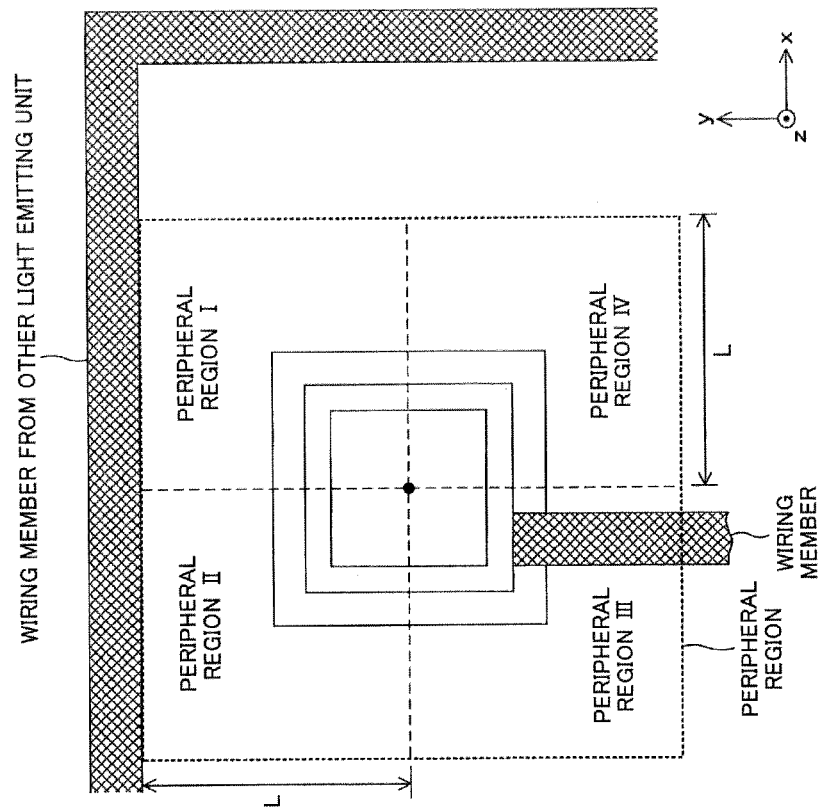
FIG. 31 is a diagram showing a peripheral region of the light emitting unit.
Figure 32A:
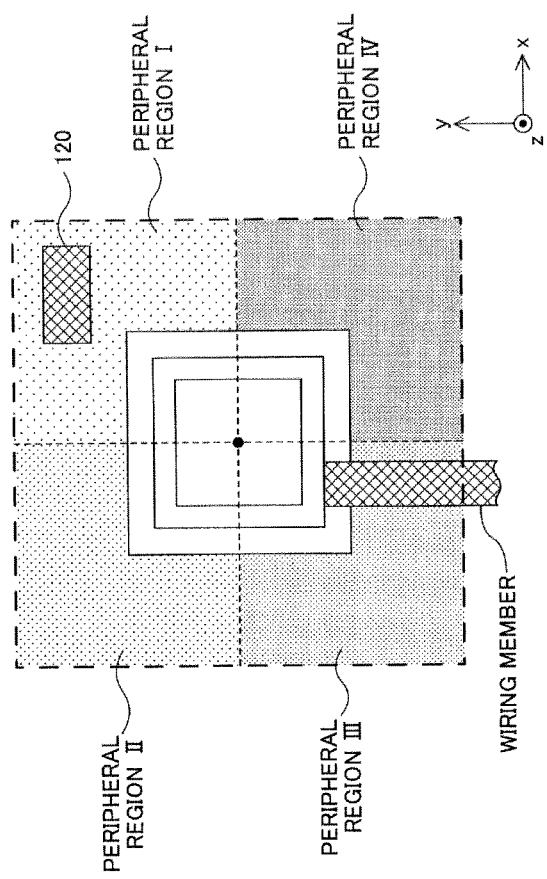

In another embodiment, when the dynamic response such as the rise and fall of laser may be degraded due to an increase in the electrode capacitance resulting from connecting the metal member 120 to the light emitting unit, the metal member 120 may be arranged at a peripheral region of the light emitting unit. In the present embodiment, as is shown in FIG. 31, the peripheral region of the light emitting unit corresponds to the region within a square having a center corresponding to the emitting region center of the light emitting unit and having a side length of 2 L where L represents the shortest distance from the emitting region center to the closest wiring member extending from another light emitting unit. In FIG. 31, the peripheral region is divided into four peripheral regions (i.e., peripheral region I, peripheral region II, peripheral region III, and peripheral regions IV) by two straight lines that pass through the emitting region center of the light emitting unit, one straight line being parallel to the polarization direction and the other straight line being perpendicular to the polarization direction.

FIGS. 32A-33B show examples in which the metal member 120 is arranged at one or more peripheral regions of the light emitting unit. It is noted that in the examples shown in FIGS. 32A-33B, since the region where the area of the wiring member is the greatest corresponds to region III, the metal member 120 is arranged at either peripheral region III or peripheral region I.

Figure 33A:
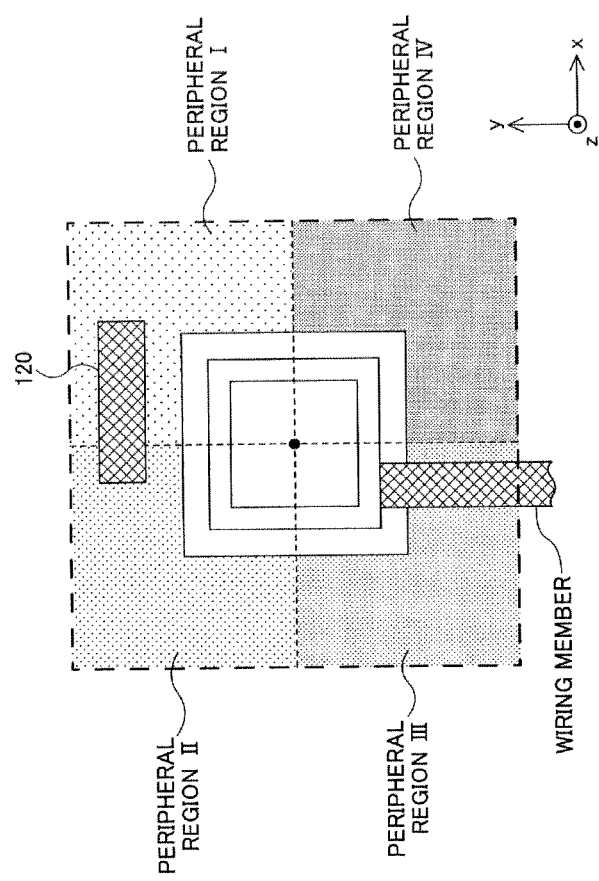

In one example, as is shown in FIG. 33A, the metal member 120 may be arranged across two peripheral regions (peripheral regions I and II in FIG. 33A) as long as a greater area portion of the metal member 120 is arranged in the peripheral region of the region where the area of the wiring member is the greatest or the peripheral region positioned diagonally with respect to the region where the area of the wiring member is the greatest. In another example, as is shown in FIG. 33B, a portion of the metal member 120 may be arranged outside the peripheral region.

According to an aspect of the present embodiment, by arranging the metal member 120 closer to the light emitting unit than the closest wiring member extending from another light emitting unit, the impact of stress from the metal member 120 may be arranged to be greater than the stress from wiring members extending from other light emitting units. In this way, stress may be controlled while preventing a capacitance increase in the light emitting unit, and the difference between p(i) and P may be adjusted to a desired value.

It is noted that Japanese Laid-Open Patent Publication No. 2005-209717 discloses a surface emitting laser having a heat emitting unit that is electrically insulated. The heat emitting unit of the disclosed surface emitting laser is arranged to cover a light emitting unit from all directions. Accordingly, such heat emitting unit may not affect the polarization direction of the light emitting unit.

It is noted that the impact of forces acting on the light emitting unit due to the wiring member may be adjusted by changing the extending direction of the wiring extending from the light emitting unit. However, when the light emitting unit is surrounded by wiring members extending from other light emitting units, it may be rather difficult to change the extending direction of the wiring member. Particularly, in a surface emitting laser array having a relatively large number of light emitting units, or a surface emitting laser array having light emitting units integrally formed at relatively short distances with respect to each other, it may be difficult to change the extending direction of the wiring member in most of the light emitting units.

In an embodiment of the present invention, adjustments may be made by merely changing a connection portion of the wiring member connected to the light emitting unit so that the wiring pattern within the surface emitting laser array or the distance between the light emitting units may not be restricted by the change. Thus, according to an aspect of the present embodiment, variations in the polarization angles of light may be reduced even in a highly integrated surface laser array where light emitting units are densely arranged, for example.

According to another aspect of the present embodiment, the polarization directions of plural light beams emitted from the mass-produced surface emitting laser array 100 may be adjusted to be within a predetermined range without having to reduce the integration density of the light emitting units.

According to another aspect of the present invention, the surface emitting laser array 100 may be arranged to have at least two light emitting units that have wiring members arranged at differing distances with respect to their corresponding emitting region centers. That is, the distance between the emitting region center of a first light emitting unit and the center line of the wiring member connected to the first light emitting unit may be arranged to be different from the distance between the emitting region center of a second light emitting unit and the center line of the wiring member connected to the second light emitting unit.

According to another aspect of the present invention, by including the surface emitting laser array 100 of the present embodiment in a light source of the optical scanning device 2010, optical scanning operations may be more accurately performed on a scanning surface, for example.

According to another aspect of the present invention, by including the optical scanning device 2010 with the surface emitting laser array 100 in the color printer 2000, a high quality image may be formed by the color printer.

As is described above with reference to FIG. 6, in the surface emitting laser array 100 according to an embodiment of the present invention, when the light emitting units v1-v40 are orthographically projected along a virtual line extending in the sub scanning corresponding direction, the light emitting units v1-v40 may be spaced apart at equal distances of d1 along the virtual line. Because of this configuration, by controlling the turn-on timings of the light emitting units v1-v40, the configuration of the surface emitting laser array 100 may be regarded as a configuration where the light emitting units are arranged at regular intervals in the sub scanning direction on the photoconductive drum 2030.

Further, for example, when the distance d1 is arranged to be 2.65 μm, and the magnification of the optical system of the optical scanning device 2010 is arranged to be 2 times, high density writing of 4800 dpi (dots per inch) may be achieved. Further densification may be achieved by increasing the number of light emitting units in the main-scanning corresponding direction, by changing the array layout by reducing the pitch d2 (see FIG. 6) in the sub-scanning corresponding direction to further reduce the distance d1, or by reducing the magnification of the optical system, for example, to thereby achieve higher quality printing. Further, the writing distance in the main scanning direction may be easily controlled by controlling the turn-on timings of the light emitting units.

Further, in this case, even when the writing dot density is increased, the color printer 2000 may perform printing without reducing the printing speed. Further, when the writing dot density is maintained the same, the printing speed may be further increased, for example.

It is noted that although the initial values of D(1)-D(40) are assumed to be 0 in the above descriptions, the present invention is not limited to such case. For example, the initial value may be set equal to a value used in manufacturing a similar surface emitting laser array.

Also, the design data obtaining process may include a step in which an operator adjusts the correction amount for the value of D(i) that is obtained based on the difference between p(i) and P, for example.

Also, it is noted that although the outline of the mesa cross-section is substantially square-shaped in the above descriptions, the present invention is not limited to such a case. For example, the outline of the mesa cross-section may be arranged to be substantially circular, as is shown in FIGS. 34A-34B. In other examples, the outline of the mesa cross-section may be arranged to be rectangular. In this case, the long side of the rectangle is preferably arranged to be parallel to the tilt axis direction of the substrate 101.

Also, it is noted that although the outline of current passage region is substantially square-shaped as viewed from the z-axis direction in the above descriptions, the present invention is not limited to such case. For example, the outline of the current passage region may be arranged to be rectangular. In this case, the long side of the rectangle is preferably arranged to be parallel to the tilt axis direction of the substrate 101.

Also, it is noted that although the normal line direction of the main surface of the substrate is tilted towards one direction A of crystal orientation [1 1 1] with respect to the direction of crystal orientation [1 0 0], the present invention is not limited to such a case. That is, an embodiment of the present invention may be applied to any substrate in which the normal line direction of the main surface of the substrate is inclined towards one direction of crystal orientation <1 1 1> with respect to one direction of crystal orientation <1 0 0>.

Figure 35A:
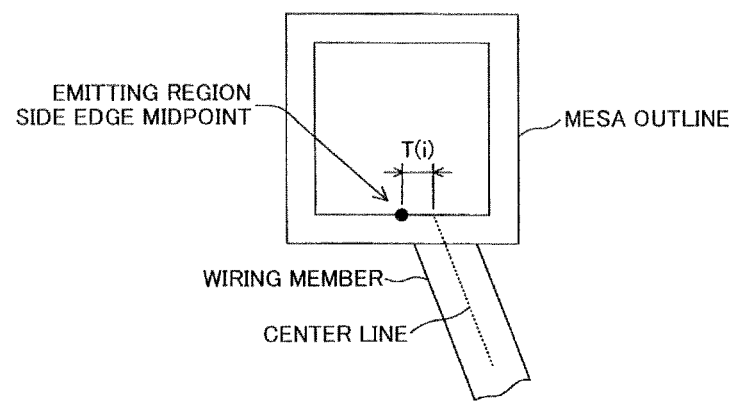
FIGS. 35A and 35B are diagrams illustrating the distance along one emitting region side edge between the midpoint of the side edge and the center line of the wiring member.
Figure 35B:
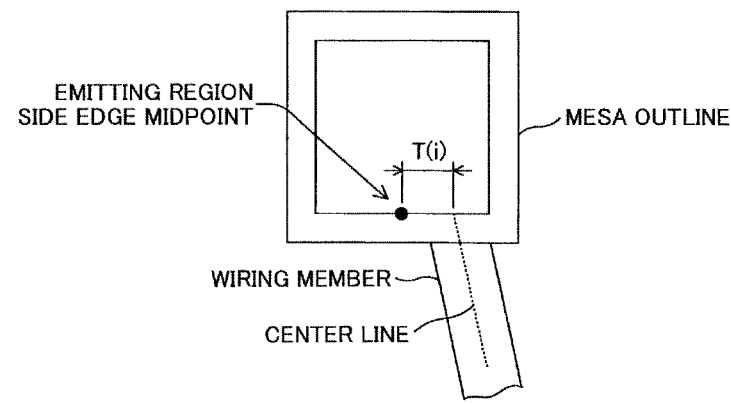

Also, in one embodiment as is shown in FIGS. 35A and 35B, instead of adjusting the distance D(i) between the emitting region center of the light emitting unit and the center line of the wiring member extending from the light emitting unit as described above, the distance T(i) along one emitting region side edge between the midpoint of the side edge of the light emitting unit and the center line of the wiring member connected to the light emitting unit may be adjusted. Also, the above metal member 120 may be connected or arranged for the light emitting unit in this embodiment as well.

Also, it is noted that although the oscillation wavelength of the light emitting unit is arranged to be in the 780 nm band in the above description, the present invention is not limited to this configuration. The oscillation wavelength may be changed in accordance with the characteristics of the photoconductive body, for example.

Also, it is noted that the above surface emitting laser array may be used in applications other than an image forming apparatus. In such a case, the oscillation wavelength may be arranged to be in the 650 nm hand, the 850 nm band, the 980 nm band, the 1.3 μm band, the 1.5 μm band or the like according the application. Further, in this case, as the semiconductor material used for the active layer, an appropriate mixed crystal semiconductor material in accordance with the oscillation wavelength may be used. For example, an AlGaInP-based mixed crystal semiconductor material may be used in the 650 nm band; an InGaAs-based mixed crystal semiconductor material may be used in the 980 nm band; and a GaInNAs (Sb)-based mixed crystal semiconductor material may be used in the 1.3 μm band and the 1.5 μm band Also, by appropriately selecting the material and the configuration of the reflection mirrors in accordance with the oscillation wavelength to be used, the light emitting unit may be formed in accordance with any oscillation wavelength. For example, as the mixed crystal other than AlGaAs mixed crystal, AlGaInP mixed crystal or the like may be used. Further, preferably, the low refractive index layer and the high refractive index leer may be formed by using materials that are transparent to the oscillation wavelength and have reflection rates that are as different from each other as possible.

Also, it is noted that although a color printer is described above as an exemplary embodiment of an image forming apparatus, the present invention is not limited to such embodiment. For example, an embodiment of the present invention may be used in a monochrome printer as well.

Also, it is noted that although an image forming apparatus that transfers a toner image on recording paper is described above, the present invention is not limited to such a case. For example, the present invention may also be applied to an image forming apparatus capable of irradiating a laser light onto a medium (such as a sheet) that is capable of developing color by the laser light.

Also, the present invention may also be applied to an image forming apparatus using a silver-salt film as an image carrier, for example. In this case, a latent image is formed on the silver-salt film by optical scanning, and the latent image may be visualized by a process similar to a developing process performed in a typical silver salt photographic process. Then, the image may be transferred to a printing paper by performing a process similar to the printing process in the typical silver salt photographic process. Such an image forming apparatus may include an optical photoengraving apparatus and an optical drawing apparatus capable of drawing a CT scan image, for example.

Further, the present invention is not limited to these embodiments, and numerous variations and modifications may be made without departing from the scope of the present invention.

The present application is based on and claims the benefit of the priority of Japanese Patent Application No. 2011-140037 filed on Jun. 24, 2011, and Japanese Patent Application No. 2012-027969 filed Feb. 13, 2012, the entire contents of which are hereby incorporated by reference.

What is claimed is:

1. A surface emitting laser array comprising:
   a light emitting unit having a lower reflection mirror, a resonator structure including an active layer, and an upper reflection mirror that are laminated on a substrate;
   an electrode arranged for the light emitting unit;
   a wiring member that establishes electrical connection between the light emitting unit and the electrode; and
   the substrate on which a plurality of the light emitting units, a plurality of the electrodes, and a plurality of the wiring members are arranged; wherein
   when viewed from a direction orthogonal to the substrate, a first distance between a center of a first light emitting unit of the light emitting units and a center line of the wiring member connected to the first light emitting unit is arranged to be different from a second distance between a center of a second light emitting unit of the light emitting units and a center line of the wiring member connected to the second light emitting unit, wherein a variation in polarization directions of the light emitting units is arranged to be within a predetermined range,
   wherein the variation in the polarization directions of the light emitting units when the first distance is different from the second distance is smaller than the variation in the polarization directions of the light emitting units when the first distance and the second distance are the same.

2. The surface emitting laser array as claimed in claim 1, wherein
   in at least one light emitting unit of the light emitting units, a distance between a center of the light emitting unit and a center line of the wiring member connected to the light emitting unit is arranged to be greater than zero, and a metal member made of a same material as the wiring member is arranged in at least one of the light emitting unit and a peripheral region surrounding the light emitting unit; and
   when the light emitting unit and the peripheral region are each divided into four regions by a first straight line and a second straight line that pass through the center of the light emitting unit within a plane parallel to the substrate, which first straight line is parallel to the polarization direction of the light emitting unit and which second straight line is orthogonal to the first straight line, the metal member is arranged in at least one of a first light emitting region having a largest area connected to the wiring member, a second light emitting region positioned diagonally with respect to the first light emitting region, a first peripheral region at a periphery of the first light emitting region, and a second peripheral region at a periphery of the second light emitting region.

3. The surface emitting laser array as claimed in claim 1, wherein
   the active layer has internal strain.

4. The surface emitting laser array as claimed in claim 1, wherein
   a normal line direction of a main surface of the substrate is tilted towards one direction of crystal orientation <1 1 1> with respect to one direction of crystal orientation <1 0 0>.

5. The surface emitting laser array as claimed in claim 4, wherein
   the light emitting unit includes a mesa structure having a height direction in the direction orthogonal to the substrate;
   a cross-section of the mesa structure that is parallel to the substrate is arranged into a quadrilateral shape; and
   the quadrilateral shape has a side that is parallel to a tilt axis of the substrate.

6. The surface emitting laser array as claimed in claim 5, wherein
   the quadrilateral shape of the mesa structure corresponds to a rectangle.

7. A surface emitting laser array comprising:
   a light emitting unit having a lower reflection mirror, a resonator structure including an active layer, and an upper reflection mirror that are laminated on a substrate;
   an electrode arranged for the light emitting unit;
   a wiring member that establishes electrical connection between the light emitting unit and the electrode; and
   the substrate on which a plurality of the light emitting units, a plurality of the electrodes, and a plurality of the wiring members are arranged; wherein
   the light emitting unit has a quadrilateral shape when viewed from a direction orthogonal to the substrate, and has the wiring member connected to one side of the quadrilateral shape; and
   when viewed from the direction orthogonal to the substrate, a first distance along the one side between a midpoint of the one side of a first light emitting unit of the emitting units and a center line of the wiring member connected to the first light emitting unit is arranged to be different from a second distance along the one side between a midpoint of the one side of a second light emitting unit of the emitting units and a center line of the wiring member connected to the second light emitting unit, wherein so that a variation in polarization directions of the light emitting units is arranged to be within a predetermined range,
   wherein the variation in the polarization directions of the light emitting units when the first distance is different from the second distance is smaller than the variation in the polarization directions of the light emitting units when the first distance and the second distance are the same.

8. The surface emitting laser array as claimed in claim 7, wherein
   in at least one light emitting unit of the light emitting units, a distance along the one side between a midpoint of the one side of the light emitting unit and a center line of the wiring member connected to the light emitting unit is arranged to be greater than zero, and a metal member made of a same material as the wiring member is arranged in at least one of the light emitting unit and a peripheral region surrounding the light emitting unit; and when the light emitting unit and the peripheral region are each divided into four regions by a first straight line and a second straight line that pass through the center of the light emitting unit within a plane parallel to the substrate, which first straight line is parallel to the polarization direction of the light emitting unit and which second straight line is orthogonal to the first straight line, the metal member is arranged in at least one of a first light emitting region having a largest area connected to the wiring member, a second light emitting region positioned diagonally with respect to the first light emitting region, a first peripheral region at a periphery of the first light emitting region, and a second peripheral region at a periphery of the second light emitting region.

9. A surface emitting laser array comprising:

a light emitting unit having a lower reflection mirror, a resonator structure including an active layer, and an upper reflection mirror that are laminated on a substrate;

an electrode arranged for the light emitting unit;

a wiring member that establishes electrical connection between the light emitting unit and the electrode; and the substrate on which a plurality of the light emitting units, a plurality of the electrodes, and a plurality of the wiring members are arranged; wherein when viewed from a direction orthogonal to the substrate, a first distance between a center of a first light emitting unit of the light emitting units and a center line of the wiring member connected to the first light emitting unit is arranged to be different from a second distance between a center of a second light emitting unit of the light emitting units and a center line of the wiring member connected to the second light emitting unit, wherein a variation in polarization directions of the light emitting units is arranged to be within a predetermined range, wherein a normal line direction of a main surface of the substrate is tilted towards one direction of crystal orientation <1 1 1> with respect to one direction of crystal orientation <1 0 0>, wherein the upper reflective mirror includes a confined structure having a current passage region surrounded by an oxidized region including an oxidized material that is generated by selectively oxidizing a portion of a selectively-oxidized layer including aluminum;

the current passage region has a quadrilateral shape when viewed from the direction orthogonal to the substrate; and the quadrilateral shape has a side that is parallel to a tilt axis of the substrate.

10. The surface emitting laser array as claimed in claim 9, wherein the quadrilateral shape of the current passage region corresponds to a rectangle.

11. An image forming apparatus comprising:

an image carrier;

an optical scanning device that scans the image carrier with light that is modulated according to image information, the optical scanning device including a light source that includes a surface emitting laser array including a light emitting unit having a lower reflection mirror, a resonator structure including an active layer, and an upper reflection mirror that are laminated on a substrate;

an electrode arranged for the light emitting unit;

a wiring member that establishes electrical connection between the light emitting unit and the electrode; and the substrate on which a plurality of the light emitting units, a plurality of the electrodes, and a plurality of the wiring members are arranged;

wherein when viewed from a direction orthogonal to the substrate, a first distance between a center of a first light emitting unit of the light emitting units and a center line of the wiring member connected to the first light emitting unit is arranged to be different from a second distance between a center of a second light emitting unit of the light emitting units and a center line of the wiring member connected to the second light emitting unit, wherein a variation in polarization directions of the light emitting units is arranged to be within a predetermined range, wherein the variation in the polarization directions of the light emitting units when the first distance is different from the second distance is smaller than the variation in the polarization directions of the light emitting units when the first distance and the second distance are the same.

12. The image forming apparatus as claimed in claim 11, wherein the image information corresponds to multicolor image information.

13. An image forming apparatus comprising:

an image carrier;

an optical scanning device that scans the image carrier with light that is modulated according to image information, the optical scanning device including a light source that includes a surface emitting laser array including a light emitting unit having a lower reflection mirror, a resonator structure including an active layer, and an upper reflection mirror that are laminated on a substrate;

an electrode arranged for the light emitting unit;

a wiring member that establishes electrical connection between the light emitting unit and the electrode; and the substrate on which a plurality of the light emitting units, a plurality of the electrodes, and a plurality of the wiring members are arranged;

wherein when viewed from a direction orthogonal to the substrate, a first distance between a center of a first light emitting unit of the light emitting units and a center line of the wiring member connected to the first light emitting unit is arranged to be different from a second distance between a center of a second light emitting unit of the light emitting units and a center line of the wiring member connected to the second light emitting unit, wherein a variation in polarization directions of the light emitting units is arranged to be within a predetermined range, wherein the light emitting unit has an anisotropic internal stress.

14. A surface emitting laser array comprising:

a light emitting unit having a lower reflection mirror, a resonator structure including an active layer, and an upper reflection minor that are laminated on a substrate;

an electrode arranged for the light emitting unit;

a wiring member that establishes electrical connection between the light emitting unit and the electrode; and the substrate on which a plurality of the light emitting units, a plurality of the electrodes, and a plurality of the wiring members are arranged; wherein the light emitting unit has a quadrilateral shape when viewed from a direction orthogonal to the substrate, and has the wiring member connected to one side of the quadrilateral shape; and when viewed from the direction orthogonal to the substrate, a first distance along the one side between a midpoint of the one side of a first light emitting unit of the emitting units and a center line of the wiring member connected to the first light emitting unit is arranged to be different from a second distance along the one side between a midpoint of the one side of a second light emitting unit of the emitting units and a center line of the wiring member connected to the second light emitting unit, wherein so that a variation in polarization directions of the light emitting units is arranged to be within a predetermined range wherein the light emitting unit has an anisotropic internal stress.

15. A surface emitting laser array comprising:

a light emitting unit having a lower reflection mirror, a resonator structure including an active layer, and an upper reflection mirror that are laminated on a substrate;

an electrode arranged for the light emitting unit;

a wiring member that establishes electrical connection between the light emitting unit and the electrode; and the substrate on which a plurality of the light emitting units, a plurality of the electrodes, and a plurality of the wiring members are arranged; wherein when viewed from a direction orthogonal to the substrate, a first distance between a center of a first light emitting unit of the light emitting units and a center line of the wiring member connected to the first light emitting unit is arranged to be different from a second distance between a center of a second light emitting unit of the light emitting units and a center line of the wiring member connected to the second light emitting unit, wherein a variation in polarization directions of the light emitting units is arranged to be within a predetermined range, wherein the light emitting unit has an anisotropic internal stress.

\* \* \* \* \*